(12) United States Patent
Song et al.

(10) Patent No.: US 11,296,164 B2
(45) Date of Patent: Apr. 5, 2022

(54) ORGANIC LIGHT EMITTING DIODE COUNTER SUBSTRATE AND DISPLAY PANEL, ARRAY SUBSTRATE FOR ORGANIC LIGHT EMITTING DIODE DISPLAY PANEL, AND FABRICATING METHOD THEREOF

(71) Applicant: BOE Technology Group Co., Ltd., Beijing (CN)

(72) Inventors: Zhen Song, Beijing (CN); Guoying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 461 days.

(21) Appl. No.: 16/344,011

(22) PCT Filed: May 18, 2018

(86) PCT No.: PCT/CN2018/087480
§ 371 (c)(1),
(2) Date: Apr. 22, 2019

(87) PCT Pub. No.: WO2019/218342
PCT Pub. Date: Nov. 21, 2019

(65) Prior Publication Data
US 2021/0335943 A1  Oct. 28, 2021

(51) Int. Cl.
*H01L 27/32* (2006.01)
*H01L 25/00* (2006.01)
*H01L 51/52* (2006.01)

(52) U.S. Cl.
CPC .......... *H01L 27/3253* (2013.01); *H01L 25/50* (2013.01); *H01L 27/3246* (2013.01);
(Continued)

(58) Field of Classification Search
CPC ... H01L 27/3253; H01L 25/50; H01L 51/525; H01L 27/3246; H01L 27/3262; H01L 27/322; H01L 27/3265
See application file for complete search history.

(56) References Cited

U.S. PATENT DOCUMENTS

2007/0013282 A1* 1/2007 Okutani .............. H01L 51/5265
                                                        313/111
2008/0143255 A1* 6/2008 Lee ..................... H01L 27/3246
                                                        313/504

(Continued)

OTHER PUBLICATIONS

International Search Report & Written Opinion dated Feb. 22, 2019, regarding PCT/CN2018/087480.

*Primary Examiner* — Selim U Ahmed
(74) *Attorney, Agent, or Firm* — Intellectual Valley Law, P.C.

(57) ABSTRACT

The present application provides an organic light emitting diode display panel having a plurality of subpixels. The organic light emitting diode display panel includes an array substrate; and a counter substrate facing the array substrate. The counter substrate includes a plurality of organic light emitting diodes. The array substrate includes a first base substrate; a plurality of thin film transistors on the first base substrate for driving light emission of the plurality of organic light emitting diodes in the counter substrate; and a first electrode layer. The first electrode layer electrically connects the plurality of organic light emitting diodes to the plurality of thin film transistors, respectively.

16 Claims, 14 Drawing Sheets

(52) U.S. Cl.
CPC .......... *H01L 51/525* (2013.01); *H01L 27/322* (2013.01); *H01L 27/3262* (2013.01); *H01L 27/3265* (2013.01)

(56) References Cited

U.S. PATENT DOCUMENTS

| | | |
|---|---|---|
| 2008/0150848 A1 | 6/2008 | Chung et al. |
| 2016/0064462 A1* | 3/2016 | Yoon ................. H01L 29/42384 257/40 |
| 2016/0149164 A1 | 5/2016 | Lee et al. |
| 2018/0047791 A1* | 2/2018 | Tsai ..................... H01L 27/322 |

* cited by examiner

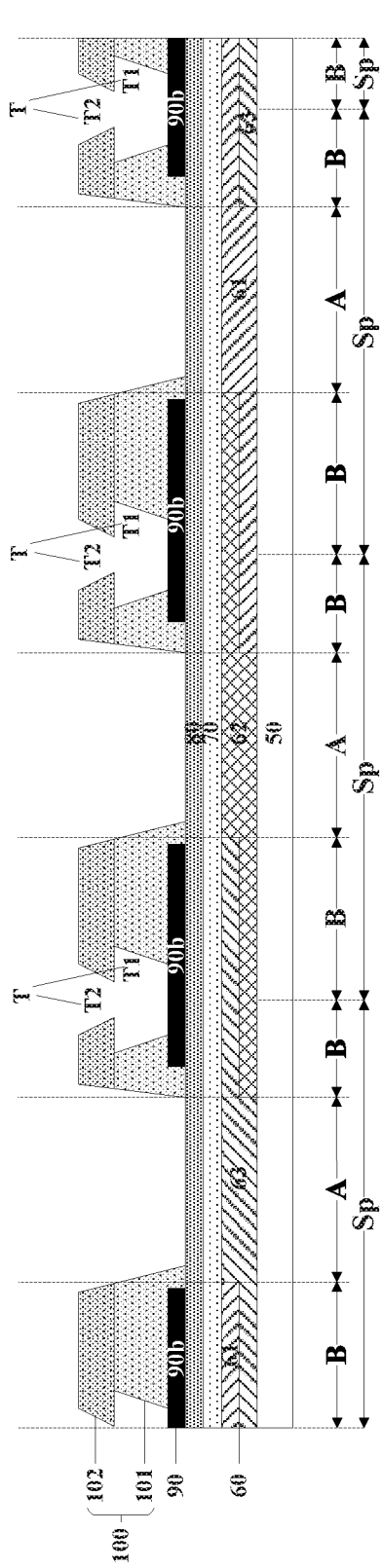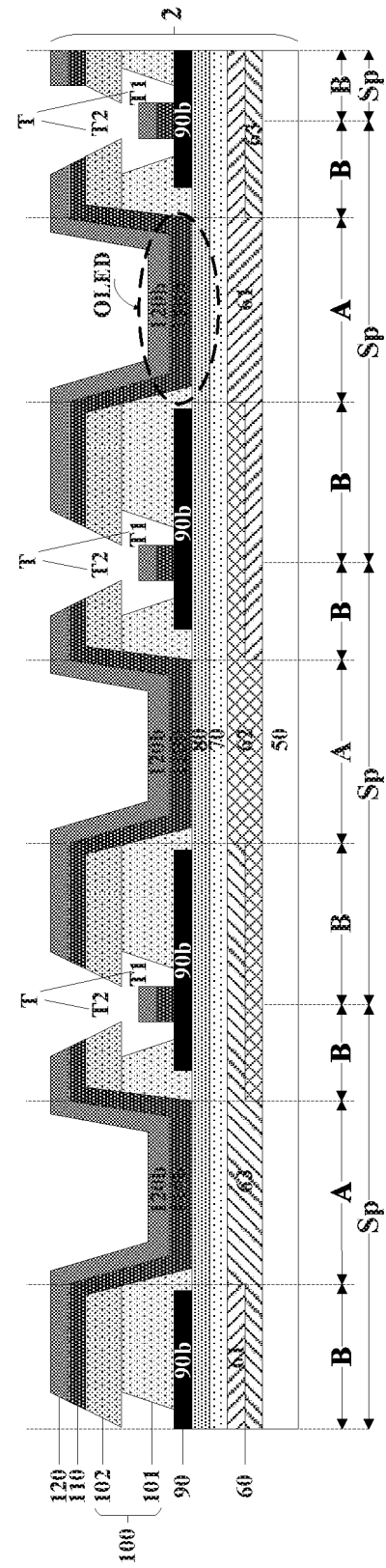

ORGANIC LIGHT EMITTING DIODE COUNTER SUBSTRATE AND DISPLAY PANEL, ARRAY SUBSTRATE FOR ORGANIC LIGHT EMITTING DIODE DISPLAY PANEL, AND FABRICATING METHOD THEREOF

CROSS-REFERENCE TO RELATED APPLICATION

This application is a national stage application under 35 U.S.C. § 371 of International Application No. PCT/CN2018/087480, filed May 18, 2018, the contents of which are incorporated by reference in the entirety.

TECHNICAL FIELD

The present invention relates to display technology, more particularly, to an organic light emitting diode display panel, an organic light emitting diode counter substrate, an array substrate for an organic light emitting diode display panel, and a fabricating method thereof.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides an organic light emitting diode display panel having a plurality of subpixels, comprising an array substrate; and a counter substrate facing the array substrate; wherein the counter substrate comprises a plurality of organic light emitting diodes; wherein the array substrate comprises a first base substrate; a plurality of thin film transistors on the first base substrate for driving light emission of the plurality of organic light emitting diodes in the counter substrate; and a first electrode layer; wherein the first electrode layer electrically connects the plurality of organic light emitting diodes to the plurality of thin film transistors, respectively.

Optionally, the array substrate further comprises a spacer layer configured to maintain a spacing between the array substrate and the counter substrate; and the first electrode layer is on a side of the spacer layer distal to the first base substrate.

Optionally, the spacer layer comprises a plurality of spacer blocks; each of the plurality of subpixels comprises a subpixel region and an inter-subpixel region; the first electrode layer comprises a plurality of first electrode blocks; and each of the plurality of first electrode blocks is on a side of a respective one of the plurality of spacer blocks distal to the first base substrate in the inter-subpixel region.

Optionally, each of the plurality of subpixels comprises at least one of the plurality of the spacer blocks.

Optionally, the counter substrate has a subpixel region and an inter-subpixel region; wherein the counter substrate in the inter-subpixel region comprises a second base substrate; a second electrode layer on the second base substrate; a pixel definition layer defining the plurality of subpixels; and a third electrode layer on a side of the pixel definition layer distal to the second electrode layer; wherein the first electrode layer in the array substrate comprises a plurality of first electrode blocks, each of which being electrically connected to a drain electrode of a respective one of the plurality of thin film transistors; and the third electrode layer in the counter substrate comprises a plurality of third electrode blocks, each of which being electrically connected to a respective one of the plurality of first electrode blocks in the array substrate.

Optionally, the counter substrate in the subpixel region comprises the second electrode layer on the second base substrate; an organic light emitting layer on a side of the second electrode layer distal to the second base substrate; and the third electrode layer on a side of the organic light emitting layer distal to the second electrode layer; wherein each of the plurality of third electrode blocks in each of the plurality of subpixels extends from the subpixel region into the inter-subpixel region.

Optionally, the organic light emitting diode display panel further comprises a trench extending through the pixel definition layer; wherein the trench spaces apart the plurality of third electrode blocks in the plurality of subpixels from each other, and separates the organic light emitting layer in the plurality of subpixels into a plurality of organic light emitting blocks.

Optionally, the trench has an opening side and a closed side opposite to the opening side; the opening side is on a side of the closed side distal to the second electrode layer; and a width of the closed side is greater than a width of the opening side.

Optionally, the trench comprises a first trench and a second trench connected to the first trench; the first trench has a first side, a second side, and a third side connecting the first side and the second side, the first side being on a side of the second side distal to the second electrode layer; the second trench has a fourth side, a fifth side, and a sixth side connecting the fourth side and the fifth side, the fourth side on a side of the fifth side distal to the second electrode layer; and a width of the first side is greater than a width of the fifth side.

Optionally, the pixel definition layer comprises a first sub-layer on a side of the second electrode layer distal to the second base substrate; and a second sub-layer on a side of the first sub-layer distal to the second electrode layer; wherein the first trench extends through the first sub-layer and the second trench extends through the second sub-layer.

Optionally, the trench is a single trench extending through the pixel definition layer; the trench has a seventh side, an eighth side, and a ninth side connecting the seventh side and the eighth side; the seventh side is on a side of the eighth side distal to the second electrode layer; and a width of the eighth side is greater than a width of the seventh side.

Optionally, the counter substrate further comprises a color filter on the second base substrate and comprising a plurality of color filter blocks; wherein edges of adjacent color filter blocks of the plurality of color filter blocks stack with each other in the inter-subpixel region.

Optionally, the counter substrate further comprises an overcoat layer on a side of the color filter distal to the second base substrate; wherein the second electrode layer is on a side of the overcoat layer distal to the second base substrate.

Optionally, the counter substrate in the inter-subpixel region further comprises a fourth electrode layer; the fourth electrode layer comprises a plurality of fourth electrode blocks; each of the plurality of fourth electrode blocks on a side of the pixel definition layer proximal to the second base substrate; and each of the plurality of fourth electrode blocks is electrically connected to the second electrode layer.

Optionally, the fourth electrode layer is on a side of the second electrode layer distal to the second base substrate.

Optionally, the counter substrate in the inter-subpixel region further comprises an organic light emitting layer between the pixel definition layer and the third electrode layer; and the organic light emitting layer in each of the plurality of subpixels extends from the subpixel region into the inter-subpixel region.

Optionally, the array substrate further comprises a capacitor electrode layer between the first electrode layer and the first base substrate; and the capacitor electrode layer comprises a plurality of capacitor electrode blocks, each of which is in a respective one of the plurality of subpixels.

Optionally, the array substrate further comprises a passivation layer between the capacitor electrode layer and the first electrode layer; each individual one of the plurality of capacitor electrode blocks, a respective one of the plurality of first electrode blocks, and the passivation layer constitute a first storage capacitor.

Optionally, each of the plurality of thin film transistors comprises an active layer, a gate electrode, a source electrode, and a drain electrode; the active layer comprises a channel part, a first conductive part electrically connected to the drain electrode, and a second conductive part electrically connected to the source electrode; the array substrate further comprises an inter-layer dielectric layer insulating the active layer from the capacitor electrode layer; each individual one of the plurality of capacitor electrode blocks, the first conductive part, and the inter-layer dielectric layer constitute a second storage capacitor; the first storage capacitor and the second storage capacitor are connected in parallel with one another to collectively constitute one of a storage capacitor.

Optionally, an orthographic projection of each individual one of the plurality of first electrode blocks on the first base substrate substantially covers an orthographic projection of the organic light emitting layer in a respective one of the plurality of subpixels on the first base substrate.

In another aspect, the present invention provides an organic light emitting diode counter substrate having a subpixel region and an inter-subpixel region; wherein the organic light emitting diode counter substrate in the inter-subpixel region comprises a second base substrate; a second electrode layer on the second base substrate; a pixel definition layer defining a plurality of subpixels; and a third electrode layer on a side of the pixel definition layer distal to the second electrode layer; wherein the organic light emitting diode counter substrate in the subpixel region comprises the second electrode layer on the second base substrate; an organic light emitting layer on a side of the second electrode layer distal to the second base substrate; and the third electrode layer on a side of the organic light emitting layer distal to the second electrode layer and comprising a plurality of third electrode blocks; wherein each of the plurality of third electrode blocks in each of the plurality of subpixels extends from the subpixel region into the inter-subpixel region.

In another aspect, the present invention provides an array substrate for an organic light emitting diode display panel having a plurality of subpixels, comprising a first base substrate; a plurality of thin film transistors on the first base substrate; a spacer layer configured to maintain a spacing between the array substrate and a counter substrate in the organic light emitting diode display panel; and a first electrode layer on a side of the spacer layer distal to the first base substrate; wherein the array substrate is absent of any organic light emitting diode.

In another aspect, the present invention provides a method of fabricating an organic light emitting diode display panel having a plurality of subpixels, comprising forming a counter substrate; forming an array substrate; and assembling the counter substrate and the array substrate together; wherein forming the counter substrate comprises forming a plurality of organic light emitting diodes; and forming the array substrate comprises forming a plurality of thin film transistors on a first base substrate for driving light emission of the plurality of organic light emitting diodes in the counter substrate; forming a spacer layer configured to maintain a spacing between the array substrate and the counter substrate; and forming a first electrode layer on a side of the spacer layer distal to the first base substrate and electrically connected to the plurality of thin film transistors.

Optionally, forming the counter substrate further comprises forming a second electrode layer on a second base substrate; forming a pixel definition layer defining the plurality of subpixels; and forming a trench extending through the pixel definition layer; wherein the trench is formed to comprise a first trench and a second trench; the first trench has a first side, a second side, and a third side connecting the first side and the second side, the first side being on a side of the second side distal to the second electrode layer; the second trench has a fourth side, a fifth side, and a sixth side connecting the fourth side and the fifth side, the fourth side on a side of the fifth side distal to the second electrode layer; and a width of the first side is greater than a width of the fifth side.

Optionally, forming the pixel definition layer comprises forming a first sub-layer and forming a second sub-layer; the first trench is formed to extend through the first sub-layer and the second trench is formed to extend through the second sub-layer.

Optionally, forming the trench comprises forming a first photoresist layer on the pixel definition layer using a first mask plate, the first photoresist layer formed to have a first pattern corresponding to the second trench, exposing a first portion of the pixel definition layer; dry-etching the first portion of the pixel definition layer, thereby forming the second trench partially extending into the pixel definition layer; removing the first photoresist layer; subsequent to removing the first photoresist layer, forming a second photoresist layer on the pixel definition layer using a second mask plate, the second photoresist layer formed to have a second pattern, exposing a second portion of the pixel definition layer; wet-etching the second portion of the pixel definition layer, thereby forming the first trench connected to the second trench; wherein the first mask plate has a first opening; the second mask plate has a second opening; the second opening has a diameter smaller than a diameter of the first opening; and wet-etching the pixel definition layer results in the first trench having an undercut profile such that the width of the first side is greater than the width of the fifth side.

BRIEF DESCRIPTION OF THE FIGURES

The following drawings are merely examples for illustrative purposes according to various disclosed embodiments and are not intended to limit the scope of the present invention.

FIGS. 9A to 9F illustrate a process of fabricating an organic light emitting diode display panel in some embodiments according to the present disclosure.

DETAILED DESCRIPTION

Figure 1:
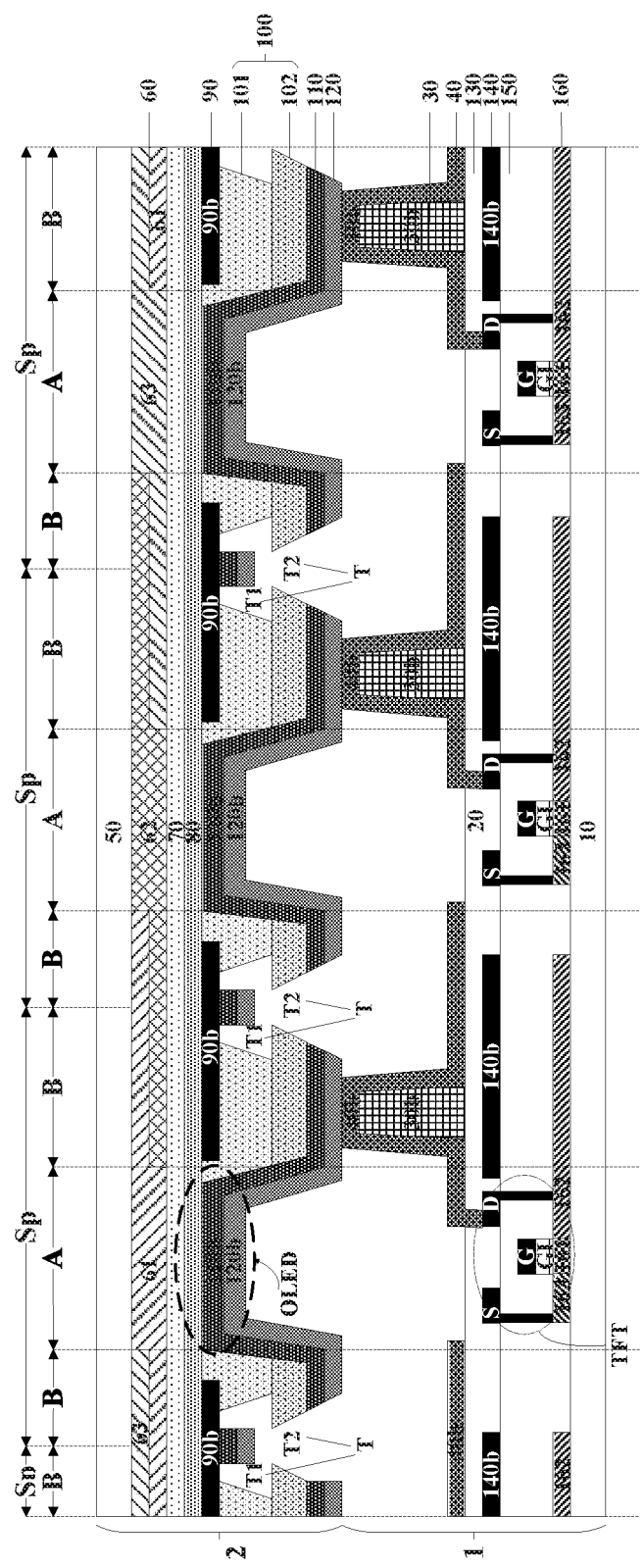
FIG. 1 is a schematic diagram illustrating the structure of an organic light emitting diode display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a conventional organic light emitting diode display panel, particularly a top emission-type conventional organic light emitting diode display panel, many defects may occur due to various limitations. For example, in the conventional organic light emitting diode display panel, subpixel regions in the array substrate are defined by a pixel definition layer in the array substrate, and subpixel region in the counter substrate are defined by a black matrix in the counter substrate. Thus, the conventional organic light emitting diode display panel can only tolerate a very small alignment error in the process of assembling the array substrate and the counter substrate. In conventional organic light emitting diode display panel, often an auxiliary cathode is formed in the counter substrate, and a spacer layer is formed on the auxiliary cathode. The adhesion between the metallic auxiliary cathode and an overcoat layer of the counter substrate is often problematic, which often results in fall-off of the auxiliary cathode from the overcoat layer. Similarly, the adhesion between the spacer layer and the auxiliary cathode could also be problematic. Peeling of the spacer layer from the counter substrate can lead to defects in display.

Accordingly, the present disclosure provides, inter aha, an organic light emitting diode display panel, an organic light emitting diode counter substrate, an array substrate for an organic light emitting diode display panel, and a fabricating method thereof that substantially obviate one or more of the problems due to limitations and disadvantages of the related art. In one aspect, the present disclosure provides an organic light emitting diode display panel having a plurality of subpixels. In some embodiments, the organic light emitting diode display panel includes an array substrate; and a counter substrate facing the array substrate. The counter substrate includes a plurality of organic light emitting diodes. The array substrate includes a first base substrate; a plurality of thin film transistors on the first base substrate for driving light emission of the plurality of organic light emitting diodes in the counter substrate; a spacer layer configured to maintain a spacing between the array substrate and the counter substrate; and a first electrode layer on a side of the spacer layer distal to the first base substrate. Optionally, the first electrode layer electrically connects the plurality of organic light emitting diodes to the plurality of thin film transistors, respectively.

As used herein, a subpixel region refers to a light emission region of a subpixel, such as a region corresponding to a pixel electrode in a liquid crystal display, or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

FIG. 1 is a schematic diagram illustrating the structure of an organic light emitting diode display panel in some embodiments according to the present disclosure. Referring to FIG. 1, the organic light emitting diode display panel in some embodiments has a plurality of subpixels Sp. Each of the plurality of subpixels Sp includes a subpixel region A and an inter-subpixel region B. In some embodiments, the organic light emitting diode display panel includes an array substrate 1; and a counter substrate 2 facing the array substrate 1. The counter substrate 2 includes a plurality of organic light emitting diodes OLED. The array substrate 1 includes a first base substrate 10; a plurality of thin film transistors TFT on the first base substrate 10 for driving light emission of the plurality of organic light emitting diodes OLED in the counter substrate 2; a spacer layer 30 configured to maintain a spacing between the array substrate 1 and the counter substrate 2; and a first electrode layer 40 on a side of the spacer layer 30 distal to the first base substrate 10. Optionally, the array substrate 1 further includes a passivation layer 20 on a side of the plurality of thin film transistors TFT distal to the first base substrate 10, and the spacer layer 30 and the first electrode layer 40 are on a side of the passivation layer 20 distal to the plurality of thin film transistors TFT. Optionally, the first electrode layer 40 electrically connects the plurality of organic light emitting diodes OLED in the counter substrate 2 to the plurality of thin film transistors TFT in the array substrate 1, respectively. In the present organic light emitting diode display panel, the plurality of thin film transistors TFT and the plurality of organic light emitting diodes OLED are disposed in two separate substrates facing each other. By disposing the plurality of organic light emitting diodes OLED in the counter substrate 2 rather than in the array substrate 1, the plurality of organic light emitting diodes OLED can be disposed on a substantially flat surface (e.g., a surface absent large segmental differences), effectively avoiding occurrence of defects in the fabrication process due to the large segmental differences. By disposing the plurality of organic light emitting diodes OLED on the counter substrate 2, a relatively larger alignment error between the counter substrate 2 and the array substrate 1 during the assembling process of the organic light emitting diode display panel can be tolerated. Moreover, the present organic light emitting diode display panel obviates the need to have a pixel definition layer in the array substrate 1 as the plurality of organic light emitting diodes OLED are disposed in the counter substrate 2.

In some embodiments, the counter substrate 2 in the inter-subpixel region B includes a second base substrate 50; a second electrode layer 80 on the second base substrate 50; a pixel definition layer 100 defining the plurality of subpixels Sp (e.g., on a side of the second electrode layer 80 distal to the second base substrate 50); and a third electrode layer 120 on a side of the pixel definition layer 100 distal to the second electrode layer 80. Optionally, the second electrode layer 80 is a substantially transparent electrode layer. Optionally, the third electrode layer 120 is a reflective electrode layer. Optionally, the third electrode layer 120 includes a plurality of third electrode blocks 120b. Light emitted from each of the plurality of organic light emitting diodes OLED is reflected by a respective one of the plurality of third electrode blocks 120b, the reflected light emits out of the organic light emitting diode display panel from the second base substrate 50 along a direction away from the third electrode layer 120. Optionally, the organic light emitting diode display panel is a top emission-type organic light emitting diode display panel.

Optionally, the second electrode layer 80 is a substantially transparent electrode layer, the third electrode layer 120 is a reflective electrode layer, and the first electrode layer 40 is also a reflective electrode layer. Light emitted from each of the plurality of organic light emitting diodes OLED is reflected by a respective one of the plurality of third electrode blocks 120b and the first electrode layer 40, the reflected light emits out of the organic light emitting diode display panel from the second base substrate 50 along a direction away from the third electrode layer 120. Optionally, the organic light emitting diode display panel is a top emission-type organic light emitting diode display panel.

Optionally, the third electrode layer 120 is a substantially transparent electrode layer. Optionally, the first electrode layer 40 is a substantially transparent electrode layer. Optionally, the organic light emitting diode display panel is a bottom emission-type organic light emitting diode display panel. Optionally, the organic light emitting diode display panel is a dual emission-type organic light emitting diode display panel.

As used herein, the term "substantially transparent" mean at least 50 percent (e.g., at least 60 percent, at least 70 percent, at least 80 percent, at least 90 percent, and at least 95 percent) of light in the visible wavelength range transmitted therethrough. As used herein, the term "reflective" mean at least 50 percent (e.g., at least 60 percent, at least 70 percent, at least 80 percent, at least 90 percent, and at least 95 percent) reflectivity of light in the visible wavelength range.

Various appropriate substantially transparent electrode materials and various appropriate fabricating methods may be used to make a substantially transparent electrode layer (e.g., the second electrode layer 80 in some examples). For example, an electrode material may be deposited on the substrate by a plasma-enhanced chemical vapor deposition (PECVD) process and patterned. Examples of appropriate substantially transparent electrode materials for making the substantially transparent electrode layer include, but are not limited to, indium tin oxide, indium zinc oxide, aluminum zinc oxide, indium gallium zinc oxide, aluminum zinc tin oxide, nano-metals such as nano-silver, conductive resins, graphene, carbon nanotubes, and the like.

Various appropriate reflective electrode materials and various appropriate fabricating methods may be used to make a reflective electrode layer (e.g., the third electrode layer 120 or the first electrode layer 40 in some examples). For example, an electrode material may be deposited on the substrate, e.g., by sputtering or vapor deposition or solution coating; and patterned. Examples of appropriate electrode materials for making the reflective electrode layer include, but are not limited to, silver, molybdenum, aluminum, titanium, gold, copper, hafnium, tantalum, alloys such as aluminum Neodymium (AlNd), molybdenum Niobium (MoNb), and laminates such as a molybdenum-aluminum-molybdenum laminated structure, a MoNb-copper-MoNb laminated structure, and a AlNd-molybdenum-AlNd laminated structure.

In some embodiments, the first electrode layer 40 in the array substrate 1 includes a plurality of first electrode blocks 40b, each of which being electrically connected to a drain electrode of a respective one of the plurality of thin film transistors TFT. In some embodiments, the third electrode layer 120 in the counter substrate 2 includes a plurality of third electrode blocks 120b, each of which being electrically connected to a respective one of the plurality of first electrode blocks 40b in the array substrate 1. Each of the plurality of first electrode blocks 40b electrically connects a respective one of the plurality of organic light emitting diodes OLED to the drain electrode D of a respective one of the plurality of thin film transistors TFT, thereby controlling light emission of the one of the plurality of thin film transistors TFT. Thus, each of the plurality of first electrode blocks 40b functions as an intermediate connecting component for electrically connecting the respective one of the plurality of third electrode blocks 120b and the drain electrode D of a respective one of the plurality of thin film transistors TFF. In some embodiments, and referring to FIG. 1, the first electrode layer 40 is substantially limited to the inter-subpixel region B. Optionally, the plurality of first electrode blocks 40b are a plurality of reflective electrode blocks. Optionally, the plurality of first electrode blocks 40b are a plurality of substantially transparent electrode blocks. Optionally, the plurality of third electrode blocks 120b are a plurality of reflective electrode blocks. Optionally, the plurality of third electrode blocks 120b are a plurality of substantially transparent electrode blocks.

Referring to FIG. 1, in some embodiments, the counter substrate 2 in the subpixel region A includes the second electrode layer 80 on the second base substrate 50; an organic light emitting layer 110 on a side of the second electrode layer 80 distal to the second base substrate 50; and the third electrode layer 120 on a side of the organic light emitting layer 110 distal to the second electrode layer 80. Optionally, each of the plurality of third electrode blocks 120b in each of the plurality of subpixels Sp extends from the subpixel region A into the inter-subpixel region B. Optionally, the second electrode layer 80 is a cathode for the plurality of organic light emitting diodes OLED, and each of the plurality of third electrode blocks 120b is an anode for a respective one of the plurality of organic light emitting diodes OLED. Optionally, the second electrode layer 80 is an anode for the plurality of organic light emitting diodes OLED, and each of the plurality of third electrode blocks 120b is a cathode for a respective one of the plurality of organic light emitting diodes OLED. Optionally, the organic light emitting layer 110 includes a plurality of organic light emitting blocks 110b, each of which is in a respective one of the plurality of subpixels Sp.

Figure 2:
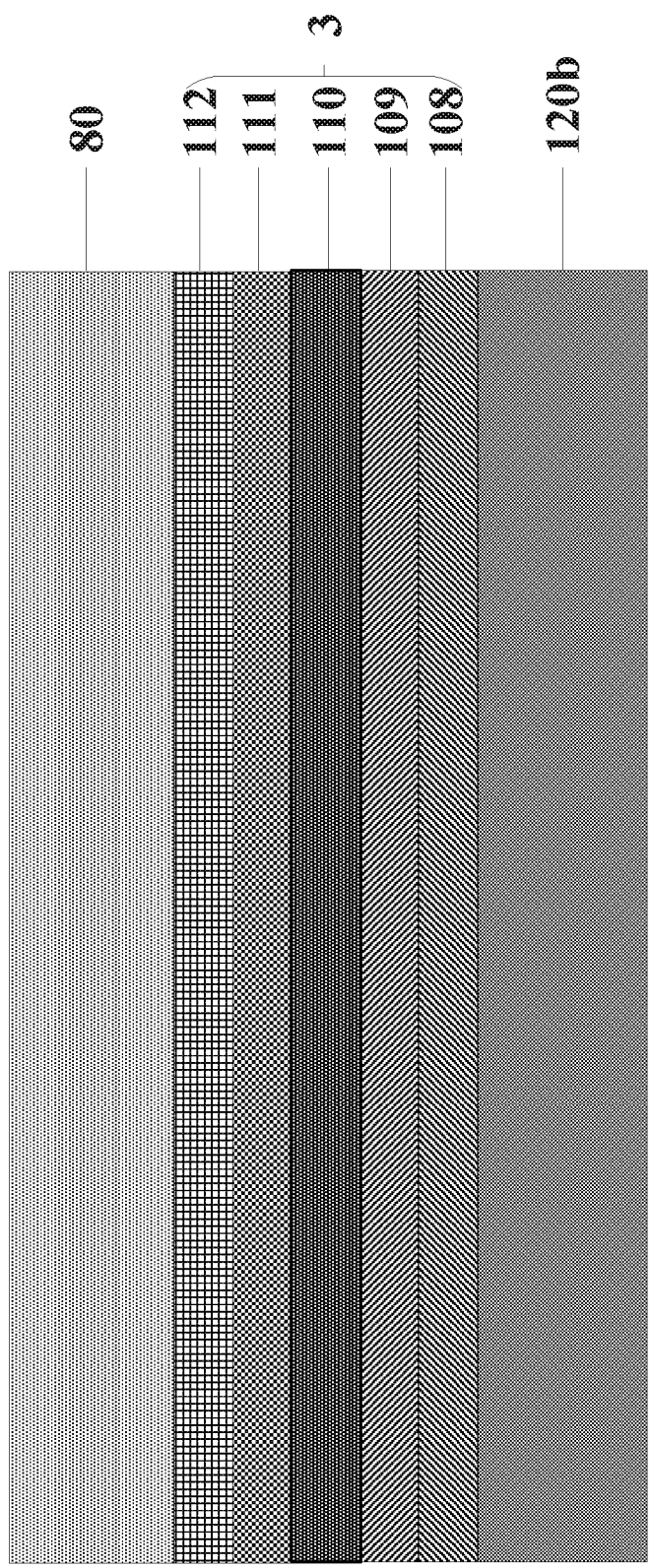
FIG. 2 is a zoom-in view of one of a plurality of organic light emitting diode in an organic light emitting diode display panel in some embodiments according to the present disclosure.

FIG. 2 is a zoom-in view of one of the plurality of organic light emitting diode in an organic light emitting diode display panel in some embodiments according to the present disclosure. Referring to FIG. 2, the counter substrate 2 in the subpixel region A in some embodiments further includes one or more organic functional layers. The organic light emitting layer 110 is one of the multiple layers of an organic layer 3. In one example, the organic layer 3 includes a hole injection layer 108 on one of the plurality of third electrode blocks 120b, a hole transport layer 109 on a side of the hole injection layer 108 distal to the one of the plurality of third electrode blocks 120b, an organic light emitting layer 110 on a side of the hole transport layer 109 distal to the hole injection layer 108, an electron transport layer 111 on a side of the organic light emitting layer 110 distal to the hole transport layer 109, and an electron injection layer 112 on a side of the electron transport layer 111 distal to the organic light emitting layer 110.

Figure 3A:
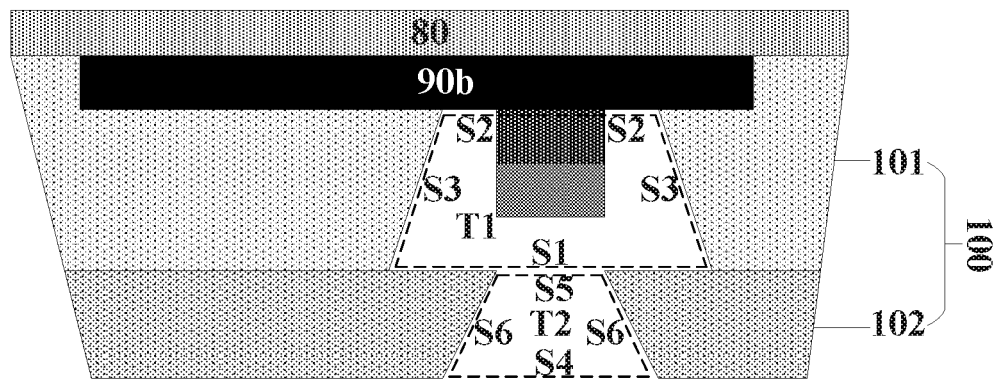
FIG. 3A is a zoom-in view of a trench in a pixel definition layer in an organic light emitting diode display panel in some embodiments according to the present disclosure.

FIG. 3A is a zoom-in view of a trench in a pixel definition layer in an organic light emitting diode display panel in some embodiments according to the present disclosure. FIG. 4 is a plan view of a trench in a pixel definition layer in an organic light emitting diode display panel in some embodiments according to the present disclosure. Referring to FIG. 3A and FIG. 4, the organic light emitting diode display panel includes a trench T extending through the pixel definition layer 100. Referring to FIGS. 1, 3, and 4, the trench T spaces apart the plurality of third electrode blocks 120b in the plurality of subpixels Sp from each other, and separates the organic light emitting layer 110 in the plurality of subpixels Sp into a plurality of organic light emitting blocks 110b. Each of the plurality of organic light emitting blocks 110b is disposed in the subpixel region A of one of the plurality of subpixels Sp, and is spaced apart from any adjacent organic light emitting block.

In some embodiments, the pixel definition layer 100 includes a first sub-layer 101 on a side of the second electrode layer 80 distal to the second base substrate 50; and a second sub-layer 102 on a side of the first sub-layer 101 distal to the second electrode layer 80. Correspondingly, the trench T includes a first trench T1 extending through the first sub-layer 101 and a second trench T2 extending through the second sub-layer 102. Referring to FIG. 1 and FIG. 3A, the first trench T1 has a first side S1, a second side S2, and a third side S3 connecting the first side S1 and the second side S2. The first side S1 is on a side of the second side S2 distal to the second electrode layer 80 and on a side of the second side S2 proximal to the second sub-layer 102. The second trench T2 has a fourth side S4, a fifth side S5, and a sixth side S6 connecting the fourth side S4 and the fifth side S5. The fourth side S4 is on a side of the fifth side S5 distal to the second electrode layer 80 and on a side of the fifth side S5 proximal to the second sub-layer 102.

Figure 3B:
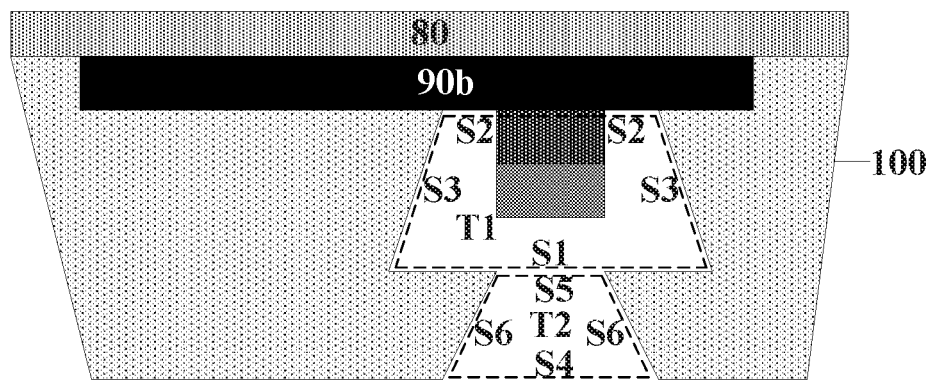
FIG. 3B is a zoom-in view of a trench in a pixel definition layer in an organic light emitting diode display panel in some embodiments according to the present disclosure.
Figure 4:
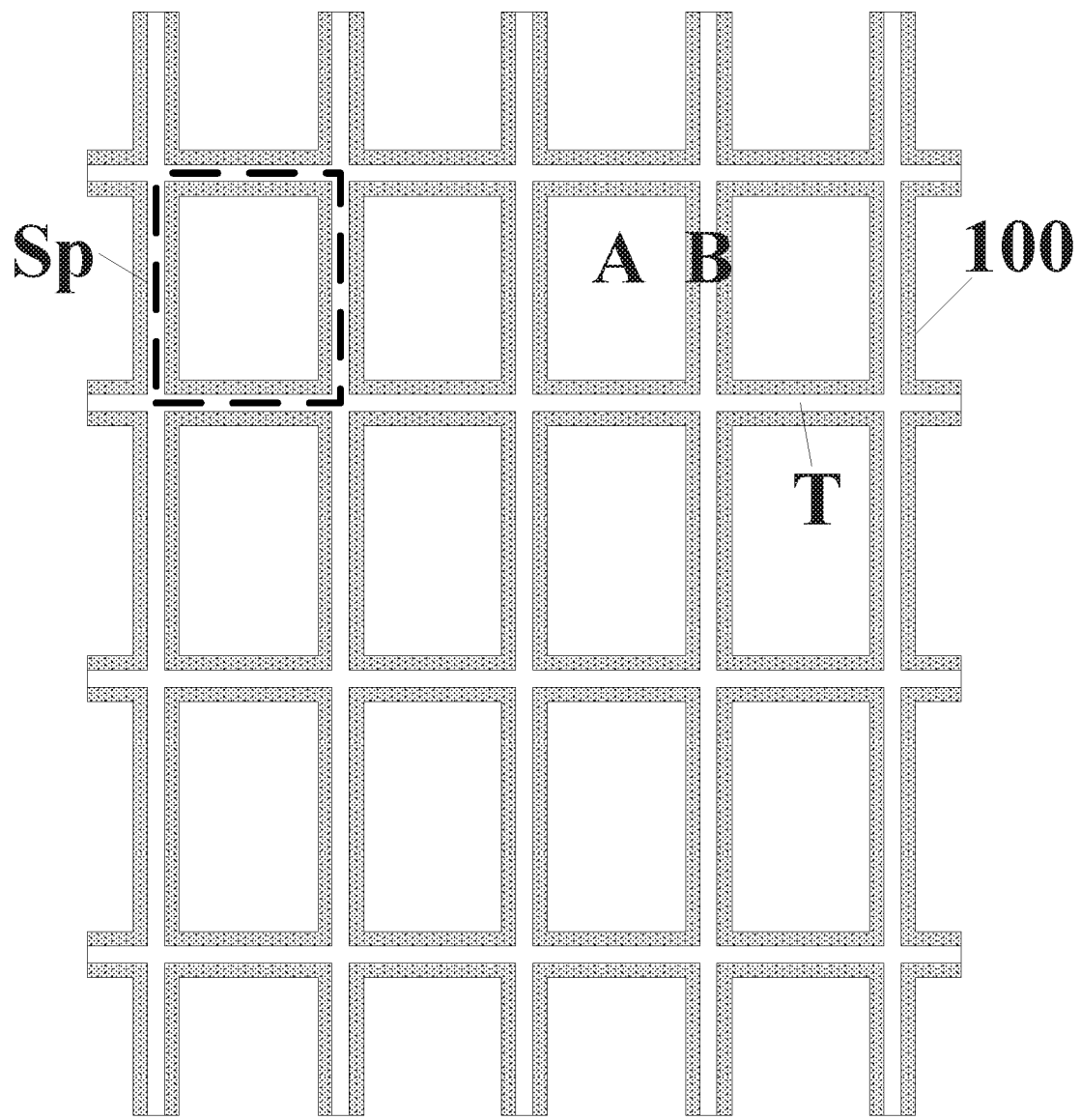
FIG. 4 is a plan view of a trench in a pixel definition layer in an organic light emitting diode display panel in some embodiments according to the present disclosure.

FIG. 3B is a zoom-in view of a trench in a pixel definition layer in an organic light emitting diode display panel in some embodiments according to the present disclosure. Referring to FIG. 3B, in some embodiments, the pixel definition layer 100 includes a single layer. As discussed in examples of fabrication methods below, in some embodiments, the first trench T1 and the second trench T2 can be formed in a pixel definition layer 100 having a single-layer structure.

In some embodiments, a width of the first side S1 is greater than a width of the fifth side S5. In forming the organic light emitting layer 110, any organic light emitting material deposited in the trench region is deposited inside the first trench T1, the trench T separates the organic light emitting layer 110 in the plurality of subpixels Sp into a plurality of organic light emitting blocks 110b. For example, the organic light emitting layer 110 discontinues at the trench T. In forming the third electrode layer 120, the trench T spaces apart the plurality of third electrode blocks 120b in the plurality of subpixels Sp from each other. For example, the third electrode layer 120 discontinues at the trench T.

Figure 3C:
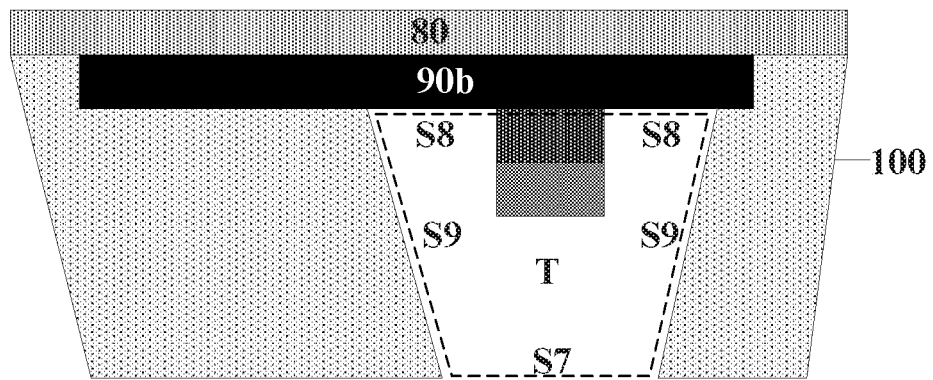
FIG. 3C is a zoom-in view of a trench in a pixel definition layer in an organic light emitting diode display panel in some embodiments according to the present disclosure.

FIG. 3C is a zoom-in view of a trench in a pixel definition layer in an organic light emitting diode display panel in some embodiments according to the present disclosure. Referring to FIG. 3C, in some embodiments, the pixel definition layer 100 includes a single layer, and the organic light emitting diode display panel includes a single trench T extending through the pixel definition layer 100. The single trench T separates the organic light emitting layer 110 in the plurality of subpixels Sp into a plurality of organic light emitting blocks 110b. Referring to FIG. 3C, the single trench T has a seventh side S7, an eighth side S8, and a ninth side S9 connecting the seventh side S7 and the eighth side S8. The seventh side S7 is on a side of the eighth side S8 distal to the second electrode layer 80. In some embodiments, a width of the eighth side S8 is greater than a width of the seventh side S7. Optionally, the cross-section of the single trench T has an inverted trapezoidal shape.

As shown in FIGS. 3A to 3C, in some embodiments, the trench T has an opening side (e.g., S4 in FIG. 3A and FIG. 3B, S7 in FIG. 3C) and a closed side (e.g., S2 in FIG. 3A and FIG. 3B, S8 in FIG. 3C) opposite to the opening side. Optionally, the opening side is on a side of the closed side distal to the second electrode layer 80. Optionally, a width of the closed side is greater than a width of the opening side.

Figure 3D:
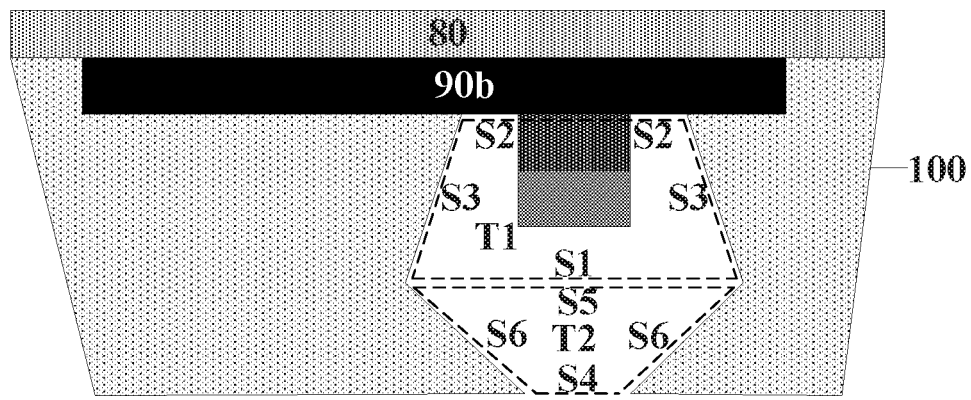
FIG. 3D is a zoom-in view of a trench in a pixel definition layer in an organic light emitting diode display panel in some embodiments according to the present disclosure.

FIG. 3D is a zoom-in view of a trench in a pixel definition layer in an organic light emitting diode display panel in some embodiments according to the present disclosure. Referring to FIG. 3D, in some embodiments, the organic light emitting diode display panel has a first trench T1 and the second trench T2 in the pixel definition layer 100. The first trench T1 has a first side S1, a second side S2, and a third side S3 connecting the first side S1 and the second side S2. The first side S1 is on a side of the second side S2 distal to the second electrode layer 80 and on a side of the second side S2 facing the second sub-layer 102. The second trench T2 has a fourth side S4, a fifth side S5, and a sixth side S6 connecting the fourth side S4 and the fifth side S5. The fourth side S4 is on a side of the fifth side S5 distal to the second electrode layer 80 and on a side of the fifth side S5 facing the second sub-layer 102. In FIG. 3D, a width of the closed side (e.g., the second side S2) is greater than a width of the opening side (e.g., the fourth side S4).

Figure 3E:
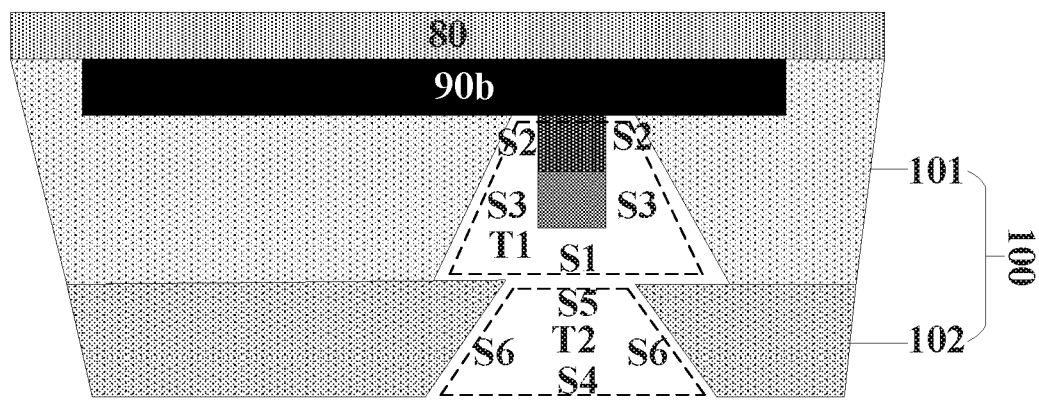
FIG. 3E is a zoom-in view of a trench in a pixel definition layer in an organic light emitting diode display panel in some embodiments according to the present disclosure.

FIG. 3E is a zoom-in view of a trench in a pixel definition layer in an organic light emitting diode display panel in some embodiments according to the present disclosure. Referring to FIG. 3E, in some embodiments, the pixel definition layer 100 includes a first sub-layer 101 on a side of the second electrode layer 80 distal to the second base substrate 50; and a second sub-layer 102 on a side of the first sub-layer 101 distal to the second electrode layer 80. Correspondingly, the trench T includes a first trench T1 extending through the first sub-layer 101 and a second trench T2 extending through the second sub-layer 102. Referring to FIG. 1 and FIG. 3E, the first trench T1 has a first side S1, a second side S2, and a third side S3 connecting the first side S1 and the second side S2. The first side S1 is on a side of the second side S2 distal to the second electrode layer 80 and on a side of the second side S2 proximal to the second sub-layer 102. The second trench T2 has a fourth side S4, a fifth side S5, and a sixth side S6 connecting the fourth side S4 and the fifth side S5. The fourth side S4 is on a side of the fifth side S5 distal to the second electrode layer 80 and on a side of the fifth side S5 proximal to the second sub-layer 102. Different from the trenches in FIGS. 3A to 3D, the trench T in FIG. 3E has a width of the opening side (e.g., the fourth side S4) greater than a width of the closed side (e.g., the second side S2).

Figure 3F:
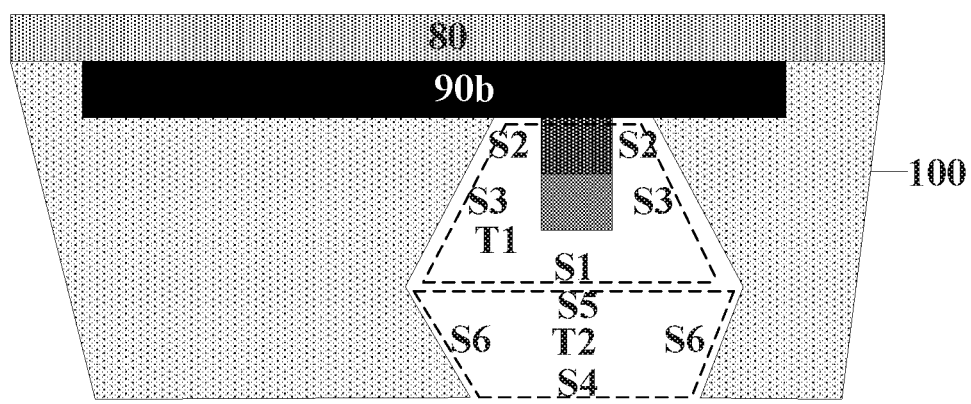
FIG. 3F is a zoom-in view of a trench in a pixel definition layer in an organic light emitting diode display panel in some embodiments according to the present disclosure.

FIG. 3F is a zoom-in view of a trench in a pixel definition layer in an organic light emitting diode display panel in some embodiments according to the present disclosure. Similarly, in FIG. 3F, a width of the opening side (e.g., the fourth side S4) is greater than a width of the closed side (e.g., the second side S2).

Various appropriate insulating materials and various appropriate fabricating methods may be used to make the pixel definition layer 100. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), silicon oxynitride ($SiO_xN_y$), and high dielectric constant (k) materials such as aluminum oxide ($AlO_x$), hafnium oxide ($HfO_x$), and tantalum oxide ($TaO_x$). Optionally, the first sub-layer 101 includes silicon oxide ($SiO_y$), and the second sub-layer 102 includes silicon nitride ($SiN_y$, e.g., $Si_3N_4$).

In some embodiments, the counter substrate 2 in the inter-subpixel region B further includes a fourth electrode layer 90. Optionally, the fourth electrode layer 90 is an auxiliary electrode for the second electrode layer 80, and is electrically connected to the second electrode layer 80. Optionally, the fourth electrode layer 90 is made of a material having a high conductivity, e.g., a metallic material. Various appropriate electrode materials and various appropriate fabricating methods may be used to make the fourth electrode layer 90. For example, an electrode material may be deposited on the substrate, e.g., by sputtering or vapor deposition or solution coating; and patterned. Examples of appropriate electrode materials for making the fourth electrode layer 90 include, but are not limited to, molybdenum, aluminum, titanium, gold, copper, hafnium, tantalum, alloys such as aluminum Neodymium (AlNd), molybdenum Niobium (MoNb), and laminates such as a molybdenum-aluminum-molybdenum laminated structure, a MoNb-copper-MoNb laminated structure, and a AlNd-molybdenum-AlNd laminated structure.

Referring to FIG. 1, the fourth electrode layer 90 in some embodiments includes a plurality of fourth electrode blocks 90b. Each of the plurality of fourth electrode blocks 90b is on a side of the second electrode layer 80 distal to the second base substrate 50, and each of the plurality of fourth electrode blocks 90b is electrically connected to the second electrode layer 80. Optionally, each of the plurality of fourth electrode blocks 90b is in direct contact with (e.g., without any intermediate layer or component) the second electrode layer 80. Optionally, an orthographic projection of each of the plurality of fourth electrode blocks 90b on the second base substrate 50 at least partially overlaps with an orthographic projection of the pixel definition layer 100 on the second base substrate 50. Optionally, the orthographic projection of the pixel definition layer 100 on the second base substrate 50 substantially covers orthographic projections of the plurality of fourth electrode blocks 90b on the second base substrate 50. Optionally, the orthographic projection of the pixel definition layer 100 on the second base substrate 50 substantially overlaps with the orthographic projections of the plurality of fourth electrode blocks 90b on the second base substrate 50.

In some embodiments, the fourth electrode layer 90 is on a side of the second electrode layer 80 proximal to the second base substrate 50, and each of the plurality of fourth electrode blocks 90b is on a side of the second electrode layer 80 proximal to the second base substrate 50. Optionally, the fourth electrode layer 90 is deposited on an overcoat layer 70.

In some embodiments, and referring to FIG. 1, the fourth electrode layer 90 is on a side of the second electrode layer 80 distal to the second base substrate 50, and each of the plurality of fourth electrode blocks 90b is on a side of the second electrode layer 80 distal to the second base substrate 50. By having the fourth electrode layer 90 on a side of the second electrode layer 80 distal to the second base substrate 50, the adhesion of the fourth electrode layer 90 (e.g., a metallic electrode layer) to the counter substrate 2 can be greatly enhanced. For example, an adhesion of a metallic fourth electrode layer 90 to the electrode material of the second electrode layer 80 is much greater than an adhesion of a metallic fourth electrode layer 90 to an organic material in a layer (e.g., an overcoat layer 70) in the counter substrate 2.

In some embodiments, the organic light emitting layer 110 in each of the plurality of subpixels Sp extends from the subpixel region A into the inter-subpixel region B, e.g., the counter substrate 2 in the inter-subpixel region B further includes the organic light emitting layer 110 between the pixel definition layer 100 and the third electrode layer 120. The organic light emitting layer 110 in the inter-subpixel region B in each of the plurality of subpixels Sp is sandwiched between the pixel definition layer 100 and one of the plurality of third electrode blocks 120b.

In some embodiments, and referring to FIG. 1, the counter substrate 2 further includes a color filter 60 on the second base substrate 50. The color filter includes a plurality of color filter blocks, e.g., a color filter block of a first color 61 for display image in a subpixel of a first color, a color filter block of a second color 62 for display image in a subpixel of a second color, and a color filter block of a third color 63 for display image in a subpixel of a third color. In some embodiments, edges of adjacent color filter blocks of the plurality of color filter blocks stack with each other in the inter-subpixel region B. For example, and referring to FIG. 1, edges of the color filter block of the first color 61 stack with an adjacent color filter block of the second color 62 in the inter-subpixel region B on a first side, and stack with an adjacent color filter block of the third color 63 in the inter-subpixel region B on a second side. Edges of the color filter block of the second color 62 stack with an adjacent color filter block of the first color 61 in the inter-subpixel region B on a first side, and stack with an adjacent color filter block of the third color 63 in the inter-subpixel region B on a second side. Edges of the color filter block of the third color 63 stack with an adjacent color filter block of the second color 62 in the inter-subpixel region B on a first side, and stack with an adjacent color filter block of the first color 61 in the inter-subpixel region B on a second side.

In some embodiments, the organic light emitting diode display panel is absent of a black matrix. Because light is substantially blocked in regions where edges of adjacent color filter blocks of the plurality of color filter blocks stack with each other in the inter-subpixel region B, a black matrix is not required in the inter-subpixel region. For example, the inter-subpixel region B of the organic light emitting diode display panel is approximately defined by the regions where edges of adjacent color filter blocks of the plurality of color filter blocks stack with each other in the inter-subpixel region B, a black matrix is not required in the inter-subpixel region. Optionally, the counter substrate is absent of a black matrix.

In some embodiments, the organic light emitting diode display panel further includes a black matrix in the inter-subpixel region. Optionally, the black matrix is in the counter substrate. Optionally, the black matrix is in the array substrate.

In some embodiments, the counter substrate 2 further includes an overcoat layer 70 on a side of the color filter 60 distal to the second base substrate 50. Optionally, the second electrode layer 80 is on a side of the overcoat layer 70 distal to the second base substrate 50.

Referring to FIG. 1, the spacer layer 30 in the array substrate 1 in some embodiments includes a plurality of spacer blocks 30b. Optionally, each of the plurality of first electrode blocks 40b is on a side of a respective one of the plurality of spacer blocks 30b distal to the first base substrate 10 in the inter-subpixel region B. Because each of the plurality of third electrode blocks 120b in the counter substrate 2 is electrically connected to the drain electrode D in a respective one of the plurality of thin film transistors TFT in the array substrate 1 through a respective one of the plurality of first electrode blocks 40b in the array substrate 1, each of the plurality of subpixels Sp in some embodiments includes at least one of the plurality of the spacer blocks 30b. Optionally, each of the plurality of subpixels Sp includes a single one of the plurality of the spacer blocks 30b. Each of the plurality of the spacer blocks 30b protrudes from a surface of the array substrate 1 toward the counter substrate 2. Optionally, one of the plurality of first electrode blocks 40b disposed on one of the plurality of the spacer blocks 30b in the array substrate 1 is in direct contact with one of the plurality of third electrode blocks 120b in the counter substrate 2.

Figure 5:
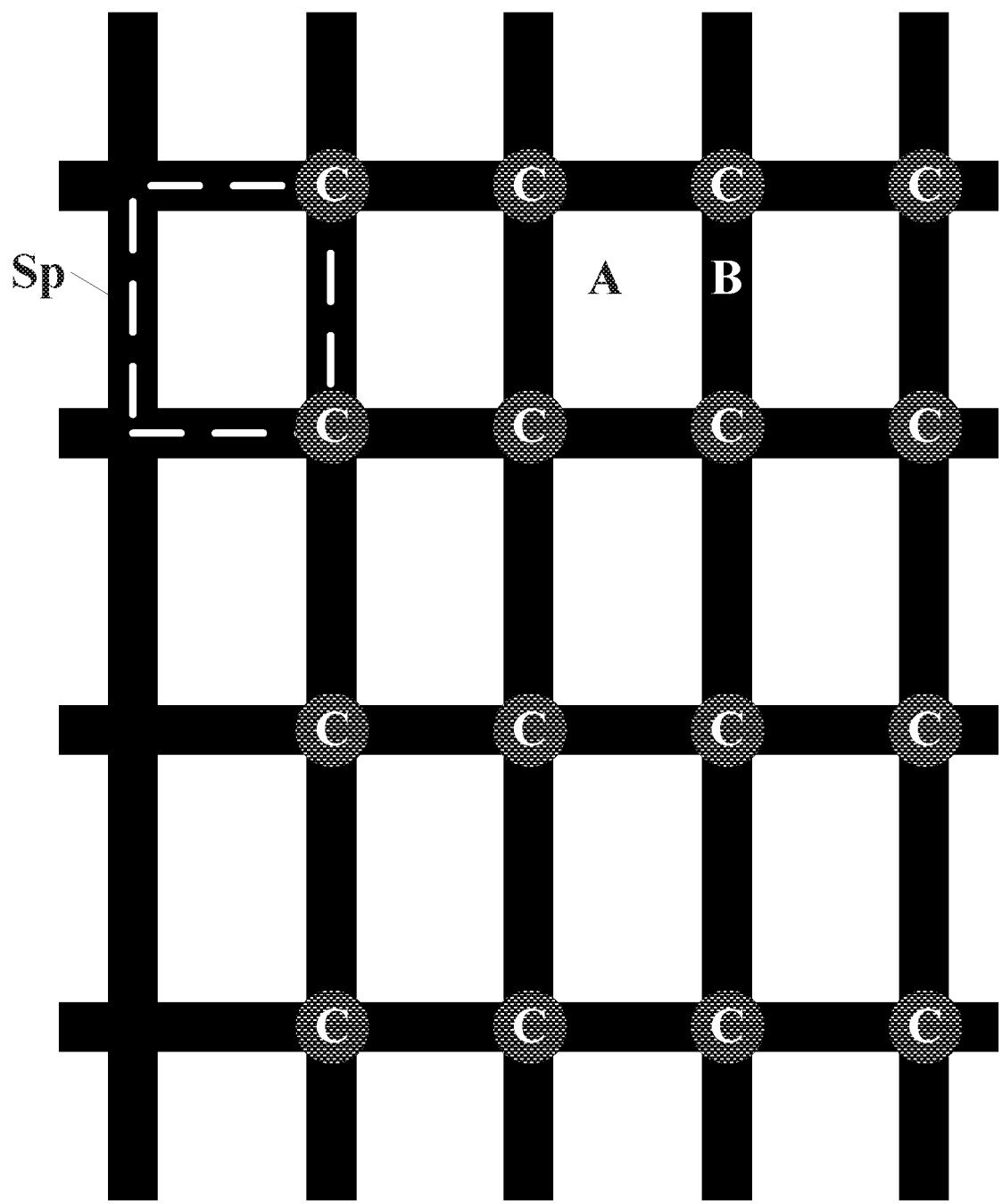
FIG. 5 is a plan view of an organic light emitting diode display panel in some embodiments according to the present disclosure.

FIG. 5 is a plan view of an organic light emitting diode display panel in some embodiments according to the present disclosure. Referring to FIG. 5, the organic light emitting diode display panel in some embodiments has a subpixel region A and an inter-subpixel region B. Moreover, the organic light emitting diode display panel has a plurality of regions C in which the plurality of spacer blocks 30b are disposed, respectively. Referring to FIG. 1 and FIG. 5, in each of the plurality of regions C having one of the plurality of spacer blocks 30b, the first electrode layer 40 is direct contact with (e.g., without any intervening layer or structure) the counter substrate 2. Optionally, in the plurality of regions C of the array substrate 1 having the plurality of spacer blocks 30b, the first electrode layer 40 is direct contact with (e.g., without any intervening layer or structure) the third electrode layer 120. In FIG. 5, the organic light emitting diode display panel has at least one of the plurality of regions C in each subpixel Sp.

In some embodiments, and referring to FIG. 1, the array substrate 1 further includes a capacitor electrode layer 140 between the first electrode layer 40 and the first base substrate 10. Optionally, the capacitor electrode layer 140 includes a plurality of capacitor electrode blocks 140b, each of which is in a respective one of the plurality of subpixels Sp. In some embodiments, the array substrate 1 further includes a passivation layer 20 between the capacitor electrode layer 140 and the first electrode layer 40. Each of the plurality of capacitor electrode blocks 140b, a respective one of the plurality of first electrode blocks 40b, and the passivation layer 20 constitute a first storage capacitor for one of the plurality of subpixels Sp. The first storage capacitor is configured to, alone or in combination with other storage capacitors, store a driving voltage supplied via a data line and generate a predetermined driving current. Optionally, an orthographic projection of each individual one of the plurality of first electrode blocks 40b on the first base substrate 10 at least partially overlaps with an orthographic projection of a respective one of the plurality of capacitor electrode blocks 140b on the first base substrate 10. Optionally, an orthographic projection of each individual one of the plurality of first electrode blocks 40b on the first base substrate 10 substantially overlaps with an orthographic projection of a respective one of the plurality of capacitor electrode blocks 140b on the first base substrate 10. As used herein, the term "substantially overlap" means that two orthographic projections are at least 80%, at least 85%, at least 90%, at least 95%, at least 96%, at least 97%, at least 98%, at least 99%, at least 99.5%, or at least 99.9% overlapping.

Various appropriate electrode materials and various appropriate fabricating methods may be used to make the capacitor electrode layer 140. For example, an electrode material may be deposited on the substrate, e.g., by sputtering or vapor deposition or solution coating; and patterned. Examples of appropriate electrode materials for making the capacitor electrode layer 140 include, but are not limited to, silver, copper, aluminum, molybdenum, alloys such as aluminum Neodymium (AlNd) and molybdenum Niobium (MoNb), and laminates thereof (e.g., a molybdenum-copper-molybdenum laminated structure).

In some embodiments, and referring to FIG. 1, each of the plurality of thin film transistors TFT includes an active layer 160, a gate electrode G, a source electrode S, and a drain electrode D. Optionally, the active layer 160 includes a channel part 161, a first conductive part 162 electrically connected to the drain electrode D, and a second conductive part 163 electrically connected to the source electrode S.

Various appropriate semiconductor materials and various appropriate fabricating methods may be used to make the active layer 160. For example, a semiconductor material may be deposited on the substrate by a plasma-enhanced chemical vapor deposition (PECVD) process and patterned. Examples of appropriate semiconductor materials for making the active layer 160 includes, but are not limited to, metal oxides (e.g., ITO, IZTO, IGTO), amorphous silicon, polycrystalline silicon, organic semiconductor materials, and the like.

In some embodiments, the array substrate 1 further includes an inter-layer dielectric layer 150 insulating the active layer 160 from the capacitor electrode layer 140. Optionally, each of the plurality of capacitor electrode blocks 140b, the first conductive part 162, and the inter-layer dielectric layer 150 constitute a second storage capacitor. The second storage capacitor is configured to, alone or in combination with other storage capacitors, store a driving voltage supplied via a data line and generate a predetermined driving current. Optionally, the first storage capacitor and the second storage capacitor are connected in parallel with one another to collectively constitute one of a storage capacitor in one of the plurality of subpixels Sp. Optionally, the first storage capacitor in combination with the second storage capacitor are configured to store a driving voltage supplied via a data line and generate a predetermined driving current. Optionally, an orthographic projection of each individual one of the plurality of capacitor electrode blocks 140b on the first base substrate 10 at least partially overlaps with an orthographic projection of the first conductive part 162 of a respective one of the plurality of thin film transistors TFT on the first base substrate 10. Optionally, the orthographic projection of each individual one of the plurality of capacitor electrode blocks 140b on the first base substrate 10 substantially overlaps with the orthographic projection of the first conductive part 162 of a respective one of the plurality of thin film transistors TFT on the first base substrate 10. Optionally, the orthographic projection of the first conductive part 162 of each individual one of the plurality of thin film transistors TFT on the first base substrate 10 substantially covers the orthographic projection of a respective one of the plurality of capacitor electrode blocks 140b on the first base substrate 10.

Accordingly, the storage capacitance of each of the plurality of subpixels Sp can be greatly enhanced by having a capacitor electrode layer 140, and optionally having a first conductive part 162 having an orthographic projection on the first base substrate 10 at least partially overlapping with an orthographic projection of the one of the plurality of capacitor electrode blocks 140b on the first base substrate 10, achieving a higher aperture ratio and display resolution in the present organic light emitting diode display panel.

In some embodiments, the channel part 161 includes a semi-conductive material, and each of the first conductive part 162 and the second conductive part 163 includes a conductive material, the conductive material of the first conductive part 162 and the second conductive part 163 includes at least one element in common with the semi-conductive material of the channel part 161. Optionally, the conductive material of the first conductive part 162 and the second conductive part 163 is converted from the semi-conductive material of the channel part 161 by a plasma treatment. Optionally, the channel part 161 includes a metal oxide semi-conductive material, and each of the first conductive part 162 and the second conductive part 163 includes a reductive plasma-treated metal oxide semi-conductive material. For example, the channel part 161 includes a metal oxide semi-conductive material, and each of the first conductive part 162 and the second conductive part 163 includes a partially metalized metal oxide semi-conductive material formed by a conductive treatment performed by reducing the oxygen content of the first conductive part 162 and the second conductive part 163. Optionally, the metal oxide semi-conductive material includes indium gallium zinc oxide. Optionally, each of the first conductive part 162 and the second conductive part 163 includes a plasma-treated indium gallium zinc oxide (e.g., treated by a hydrogen plasma, a helium plasma, a nitrogen plasma, an argon plasma, a $NH_3$ plasma, or a combination thereof). Optionally, each of the first conductive part 162 and the second conductive part 163 includes a metal, and the channel part 161 includes an oxidative plasma-treated metal material.

Optionally, the capacitor electrode layer 140 is in a same layer as the source electrode S and the drain electrode D. Optionally, the capacitor electrode layer 140 is in a same layer as the gate electrode G.

In some embodiments, the organic light emitting diode display panel is a top emission-type organic light emitting diode display panel. Optionally, the first electrode layer 40 is a reflective electrode layer. Optionally, the third electrode layer 120 is a substantially transparent electrode layer. Optionally, light emitted from each of the plurality of organic light emitting diodes OLED transmits through the third electrode layer 120, and is reflected by the first electrode layer 40, the reflected light emits out of the organic light emitting diode display panel from the second base substrate 50 along a direction away from the third electrode layer 120.

Figure 6:
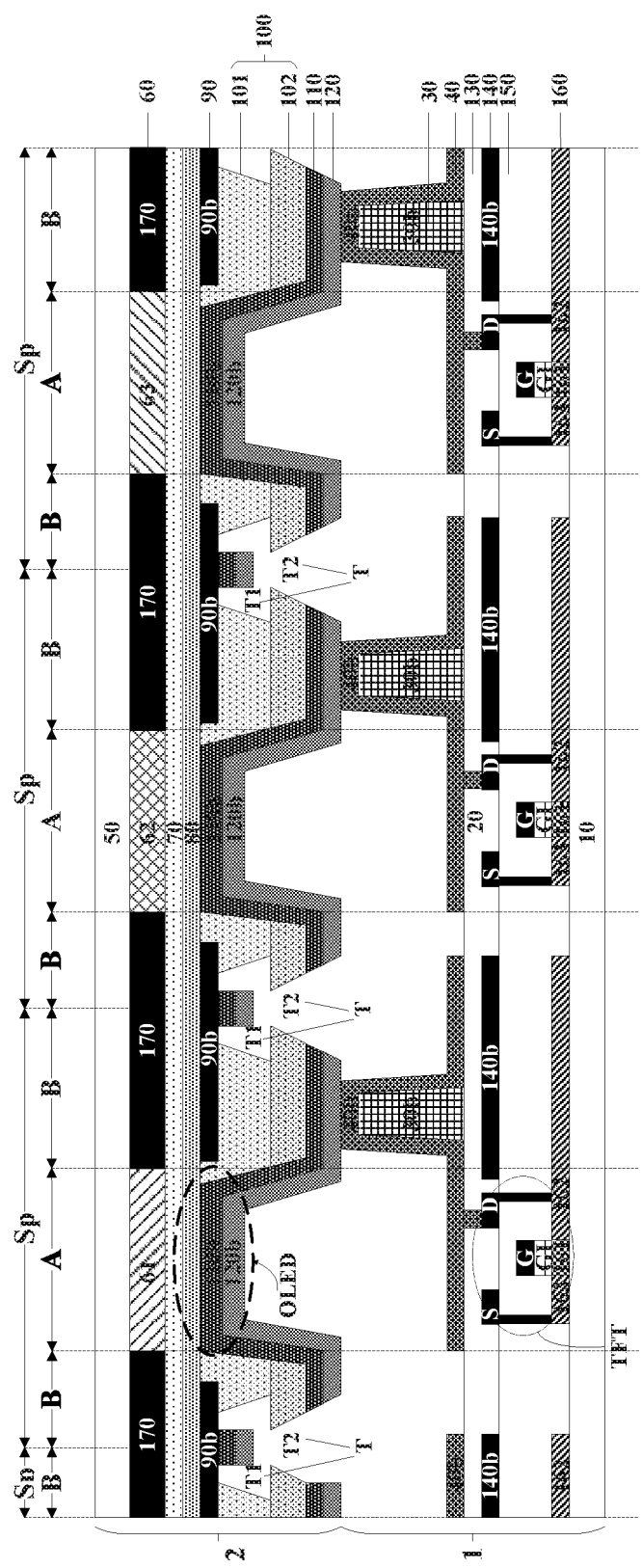
FIG. 6 is a schematic diagram illustrating the structure of an organic light emitting diode display panel in some embodiments according to the present disclosure.

FIG. 6 is a schematic diagram illustrating the structure of an organic light emitting diode display panel in some embodiments according to the present disclosure. Referring to FIG. 6, in some embodiments, the first electrode layer 40 is a reflective electrode layer, and the third electrode layer 120 is a substantially transparent electrode layer. In some embodiments, an orthographic projection of each individual one of the plurality of first electrode blocks 40b on the second base substrate 50 at least partially overlaps with an orthographic projection of the corresponding subpixel region A on the second base substrate 50. Optionally, the orthographic projection of each individual one of the plurality of first electrode blocks 40b on the second base substrate 50 substantially covers the orthographic projection of the corresponding subpixel region A on the second base substrate 50.

In some embodiments, the orthographic projection of each individual one of the plurality of first electrode blocks 40b on the second base substrate 50 at least partially overlaps with an orthographic projection of a respective one of the plurality of third electrode blocks 120b on the second base substrate 50. Optionally, the orthographic projection of each individual one of the plurality of first electrode blocks 40b on the second base substrate 50 substantially covers the orthographic projection of a respective one of the plurality of third electrode blocks 120b on the second base substrate 50.

In some embodiments, the orthographic projection of each individual one of the plurality of first electrode blocks 40b on the second base substrate 50 at least partially overlaps with an orthographic projection of a respective one of plurality of organic light emitting diodes OLED on the second base substrate 50. Optionally, the orthographic projection of each individual one of the plurality of first electrode blocks 40*b* on the second base substrate 50 substantially covers the orthographic projection of a respective one of plurality of organic light emitting diodes OLED on the second base substrate 50.

In some embodiments, the orthographic projection of one of the plurality of first electrode blocks 40*b* on the second base substrate 50 at least partially overlaps with an orthographic projection of one of the plurality of organic light emitting blocks 110*b* in a respective one of the plurality of subpixels Sp on the second base substrate 50. Optionally, the orthographic projection of one of the plurality of first electrode blocks 40*b* on the second base substrate 50 substantially covers the orthographic projection of one of the plurality of organic light emitting blocks 110*b* in a respective one of the plurality of subpixels Sp on the second base substrate 50. Optionally, an orthographic projection of the first electrode layer 40 on the second base substrate 50 at least partially overlaps with the organic light emitting layer 110 on the second base substrate 50. Optionally, the orthographic projection of the first electrode layer 40 on the second base substrate 50 substantially covers the organic light emitting layer 110 on the second base substrate 50.

In another aspect, the present disclosure provides an organic light emitting diode counter substrate having a subpixel region and an inter-subpixel region, and includes a plurality of subpixels. In some embodiments, the organic light emitting diode counter substrate in the inter-subpixel region includes a second base substrate; a second electrode layer on the second base substrate; a pixel definition layer defining the plurality of subpixels (e.g., on a side of the second electrode layer distal to the second base substrate); and a third electrode layer on a side of the pixel definition layer distal to the second electrode layer and including a plurality of third electrode blocks. Optionally, the organic light emitting diode counter substrate in the subpixel region includes the second electrode layer on the second base substrate; an organic light emitting layer on a side of the second electrode layer distal to the second base substrate; and the third electrode layer on a side of the organic light emitting layer distal to the second electrode layer. Optionally, each of the plurality of third electrode blocks in each of the plurality of subpixels extends from the subpixel region into the inter-subpixel region.

Figure 7:
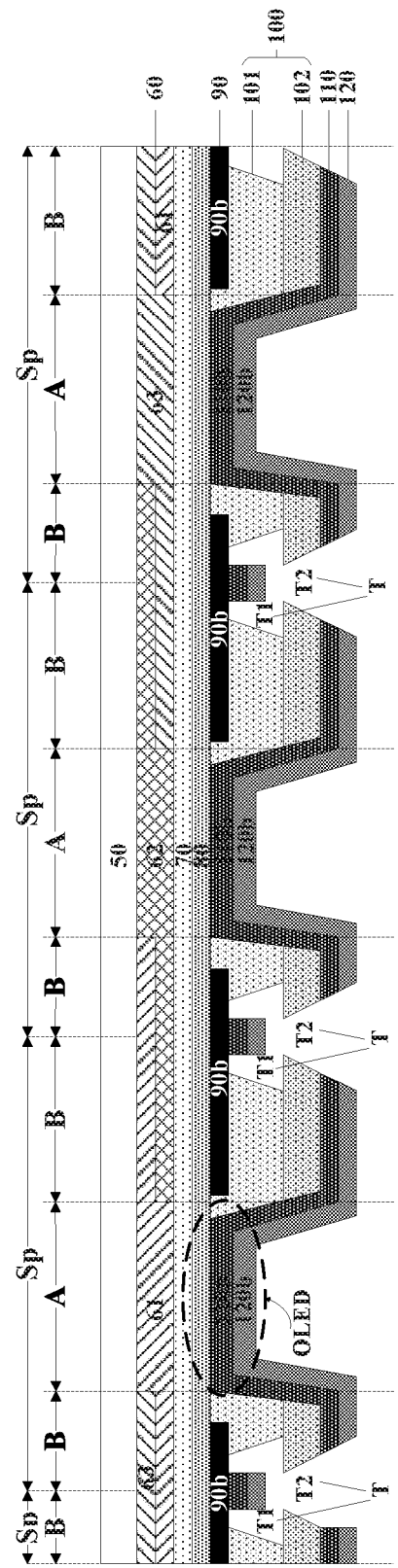
FIG. 7 is a schematic diagram illustrating the structure of an organic light emitting diode counter substrate in some embodiments according to the present disclosure.

FIG. 7 is a schematic diagram illustrating the structure of an organic light emitting diode counter substrate in some embodiments according to the present disclosure. Referring to FIG. 7, the organic light emitting diode counter substrate in some embodiments includes a plurality of subpixels Sp, and has a subpixel region A and an inter-subpixel region B. The organic light emitting diode counter substrate includes a plurality of organic light emitting diodes OLED, and is absent of any thin film transistor. The organic light emitting diode counter substrate has a subpixel region A and an inter-subpixel region B. In some embodiments, the organic light emitting diode counter substrate in the inter-subpixel region B includes a second base substrate 50; a second electrode layer 80 on the second base substrate 50; a pixel definition layer 100 defining the plurality of subpixels Sp (e.g., on a side of the second electrode layer 80 distal to the second base substrate 50); and a third electrode layer 120 on a side of the pixel definition layer 100 distal to the second electrode layer 80. Optionally, the second electrode layer 80 is a substantially transparent electrode layer. Optionally, the third electrode layer 120 is a reflective electrode layer.

In another aspect, the present disclosure provides an array substrate for an organic light emitting diode display panel. In some embodiments, the array substrate includes a plurality of subpixels, and has a subpixel region and an inter-subpixel region. In some embodiments, the array substrate includes a first base substrate; a plurality of thin film transistors on the first base substrate; a spacer layer configured to maintain a spacing between the array substrate and a counter substrate in the organic light emitting diode display panel; and a first electrode layer on a side of the spacer layer distal to the first base substrate. Optionally, the array substrate is absent of any organic light emitting diode.

Figure 8:
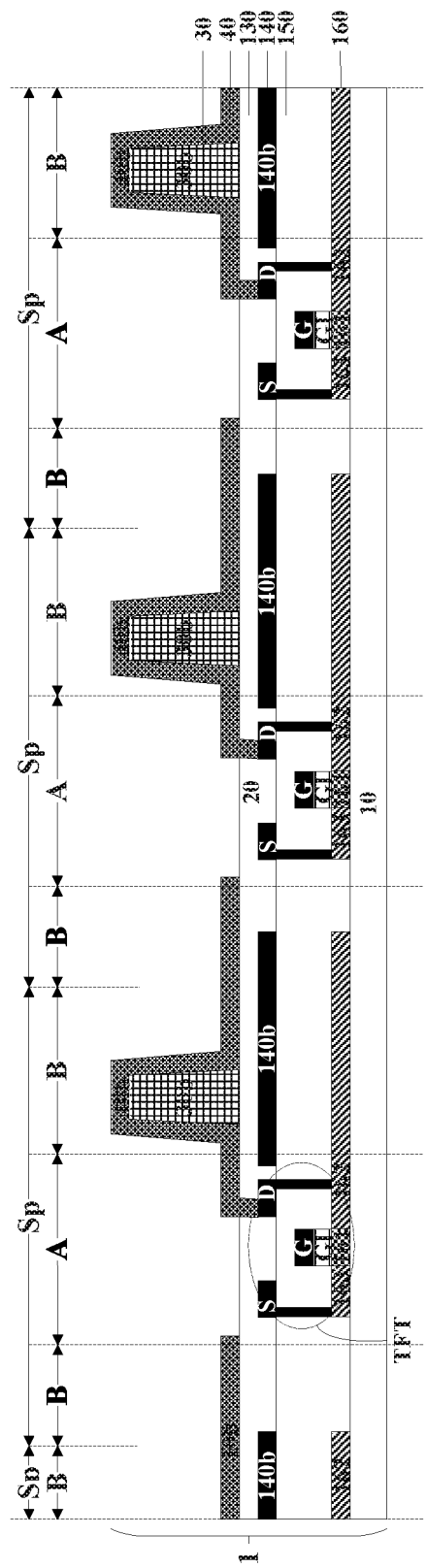
FIG. 8 is a schematic diagram illustrating the structure of an array substrate in some embodiments according to the present disclosure.

FIG. 8 is a schematic diagram illustrating the structure of an array substrate in some embodiments according to the present disclosure. Referring to FIG. 8, the array substrate includes a first base substrate 10; a plurality of thin film transistors TFT on the first base substrate 10 for driving light emission of the plurality of organic light emitting diodes OLED in the organic light emitting diode display panel; a spacer layer 30 configured to maintain a spacing between the array substrate and a counter substrate in the organic light emitting diode display panel; and a first electrode layer 40 on a side of the spacer layer 30 distal to the first base substrate 10. Optionally, the array substrate further includes a passivation layer 20 on a side of the plurality of thin film transistors TFT distal to the first base substrate 10, and the spacer layer 30 and the first electrode layer 40 are on a side of the passivation layer 20 distal to the plurality of thin film transistors TFT.

In another aspect, the present disclosure provides a method of fabricating an organic light emitting diode display panel having a plurality of subpixels. In some embodiments, the method includes forming a counter substrate; forming an array substrate; and assembling the counter substrate and the array substrate together. In some embodiments, the step of forming the counter substrate includes forming a plurality of organic light emitting diodes; and the step of forming the array substrate includes forming a plurality of thin film transistors on a first base substrate for driving light emission of the plurality of organic light emitting diodes in the counter substrate; forming a spacer layer configured to maintain a spacing between the array substrate and the counter substrate; and forming a first electrode layer on a side of the spacer layer distal to the first base substrate and electrically connected to the plurality of thin film transistors. Optionally, the first electrode layer is formed to electrically connects the plurality of organic light emitting diodes to the plurality of thin film transistors, respectively. Optionally, the step of forming the first electrode layer in the array substrate includes forming a plurality of first electrode blocks, each of which is formed to be electrically connected to a drain electrode of a respective one of the plurality of thin film transistors.

In some embodiments, the step of forming the counter substrate includes, in the inter-subpixel region, forming a second electrode layer on a second base substrate; forming a pixel definition layer defining the plurality of subpixels (e.g., on a side of the second electrode layer distal to the second base substrate); and forming a third electrode layer on a side of the pixel definition layer distal to the second electrode layer. Optionally, the step of forming the third electrode layer in the counter substrate includes forming a plurality of third electrode blocks, each of which is formed to be electrically connected to a respective one of the plurality of first electrode blocks in the array substrate.

In some embodiments, the step of forming the counter substrate includes, in the subpixel region, forming the second electrode layer on the second base substrate; forming an organic light emitting layer on a side of the second electrode layer distal to the second base substrate; and forming the third electrode layer on a side of the organic light emitting layer distal to the second electrode layer. Optionally, the third electrode layer is formed so that each of the plurality of third electrode blocks in each of the plurality of subpixels extends from the subpixel region into the inter-subpixel region.

In some embodiments, the step of forming the counter substrate further includes forming a second electrode layer on a second base substrate; forming a trench extending through the pixel definition layer. Optionally, the trench is formed to space apart the plurality of third electrode blocks in the plurality of subpixels from each other, and separate the organic light emitting layer in the plurality of subpixels into a plurality of organic light emitting blocks.

In some embodiments, forming the trench includes forming a first trench and forming a second trench connected to the first trench. The first trench is formed to have a first side, a second side, and a third side connecting the first side and the second side, the first side being on a side of the second side distal to the second electrode layer. The second trench is formed to have a fourth side, a fifth side, and a sixth side connecting the fourth side and the fifth side, the fourth side on a side of the fifth side distal to the second electrode layer. The first trench and the second trench are formed so that a width of the first side is greater than a width of the fifth side.

In some embodiments, the step of forming the pixel definition layer includes forming a first sub-layer on a side of the second electrode layer distal to the second base substrate; and forming a second sub-layer on a side of the first sub-layer distal to the second electrode layer. Optionally, the trench is formed to include a first trench extending through the first sub-layer and a second trench extending through the second sub-layer. Optionally, the first trench is formed to have a first side, a second side, and a third side connecting the first side and the second side, the first side being on a side of the second side distal to the second electrode layer. Optionally, the second trench is formed to have a fourth side, a fifth side, and a sixth side connecting the fourth side and the fifth side, the fourth side on a side of the fifth side distal to the second electrode layer. Optionally, the first trench and the second trench are formed so that a width of the first side is greater than a width of the fifth side.

In some embodiments, the step of forming the counter substrate further includes, in the inter-subpixel region, forming a fourth electrode layer. Optionally, the step of forming the fourth electrode layer includes forming a plurality of fourth electrode blocks. Optionally, each of the plurality of fourth electrode blocks is formed on a side of the pixel definition layer proximal to the second base substrate. Optionally, each of the plurality of fourth electrode blocks is formed to be electrically connected to the second electrode layer. Optionally, the fourth electrode layer is formed on a side of the second electrode layer distal to the second base substrate. Optionally, the fourth electrode layer is formed on a side of the second electrode layer proximal to the second base substrate.

In some embodiments, the organic light emitting layer in each of the plurality of subpixels is formed to extend from the subpixel region into the inter-subpixel region. Optionally, the step of forming the counter substrate further includes, in the inter-subpixel region, forming the organic light emitting layer between the pixel definition layer and the third electrode layer.

In some embodiments, the step of forming the counter substrate further includes forming a color filter on the second base substrate. Optionally, the step of forming the color filter includes forming a plurality of color filter blocks.

Optionally, the plurality of color filter blocks are formed so that edges of adjacent color filter blocks of the plurality of color filter blocks stack with each other in the inter-subpixel region. Optionally, the step of forming the counter substrate further includes forming an overcoat layer on a side of the color filter distal to the second base substrate. Optionally, the second electrode layer is formed on a side of the overcoat layer distal to the second base substrate.

In some embodiments, the step of forming the array substrate further includes forming a capacitor electrode layer between the first electrode layer and the first base substrate. Optionally, the step of forming the capacitor electrode layer includes forming a plurality of capacitor electrode blocks, each of which is formed in a respective one of the plurality of subpixels. Optionally, the step of forming the array substrate further includes forming a passivation layer between the capacitor electrode layer and the first electrode layer. Optionally, each of the plurality of capacitor electrode blocks, a respective one of the plurality of first electrode blocks, and the passivation layer are formed to constitute a first storage capacitor.

In some embodiments, the step of forming the plurality of thin film transistors includes forming an active layer, forming a gate electrode, and forming a source electrode and a drain electrode. Optionally, forming the active layer includes forming a channel part, forming a first conductive part electrically connected to the drain electrode, and forming a second conductive part electrically connected to the source electrode. Optionally, the step of forming the array substrate further includes forming an inter-layer dielectric layer insulating the active layer from the capacitor electrode layer. Optionally, each of the plurality of capacitor electrode blocks, the first conductive part, and the inter-layer dielectric layer are formed to constitute a second storage capacitor. Optionally, the first storage capacitor and the second storage capacitor are connected in parallel with one another to collectively constitute one of a storage capacitor.

In some embodiments, forming the active layer includes forming a semi-conductive material layer on the first base substrate; and applying a conductive treatment on a first part and a second part of the semi-conductive material layer thereby forming the first conductive part and the second conductive part. Optionally, a third part of the semi-conductive material layer between the first part and the second part of the second semi-conductive material layer is substantially untreated by the conductive treatment thereby forming the channel part. Optionally, the conductive treatment is performed using a plasma, e.g., a hydrogen plasma, a helium plasma, a nitrogen plasma, an argon plasma, a $NH_3$ plasma, or a combination thereof.

In some embodiments, the step of forming the spacer layer includes forming a plurality of spacer blocks. Optionally, each of the plurality of first electrode blocks is formed on a side of a respective one of the plurality of spacer blocks distal to the first base substrate in the inter-subpixel region. Optionally, the spacer layer is formed so that at least one of the plurality of the spacer blocks is formed in each of the plurality of subpixels.

Optionally, the first electrode layer and the organic light emitting layer are formed so that an orthographic projection of one of the plurality of first electrode blocks on the first base substrate substantially covers an orthographic projection of the organic light emitting layer in one of the plurality of subpixels on the first base substrate.

FIGS. 9A to 9F illustrate a process of fabricating an organic light emitting diode display panel in some embodiments according to the present disclosure. Referring to FIG.

9A, a color filter 60 is formed on a second base substrate 50. The color filter 60 is formed to include a plurality of color filter blocks, e.g., a color filter block of a first color 61 for display image in a subpixel of a first color, a color filter block of a second color 62 for display image in a subpixel of a second color, and a color filter block of a third color 63 for display image in a subpixel of a third color. In some embodiments, the color filter 60 is formed so that edges of adjacent color filter blocks of the plurality of color filter blocks stack with each other in the inter-subpixel region B. Subsequently, an overcoat layer 70 is formed on a side of the color filter 60 distal to the second base substrate 50, a second electrode layer 80 is formed on a side of the overcoat layer 70 distal to the second base substrate 50, and a fourth electrode layer 90 is formed on a side of the second electrode layer 80 distal to the overcoat layer 70. The fourth electrode layer 90 is formed to include a plurality of fourth electrode blocks 90b, each of which is formed in the inter-subpixel region B.

Figure 9A:
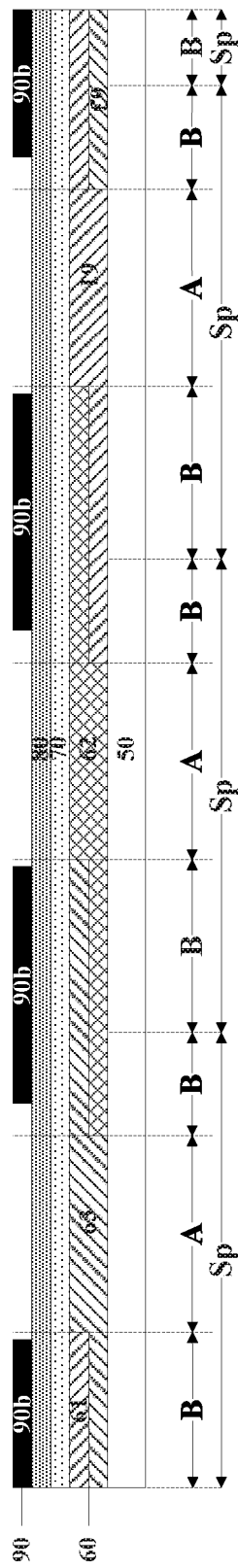
Figure 9B:
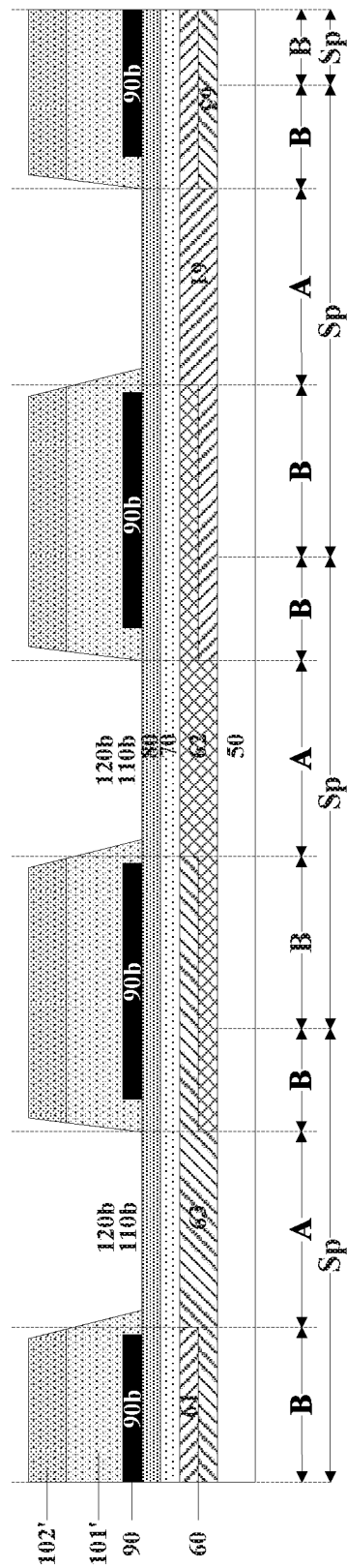

Referring to FIG. 9B, a first insulating material layer 101' is formed on a side of the fourth electrode layer 90 distal to the second electrode layer 80, and a second insulating material layer 102' is formed on a side of the first insulating material layer 101' distal to the fourth electrode layer 90. The first insulating material layer 101' and the second insulating material layer 102' may be formed by a lithography process, e.g., by depositing an insulating material layer on the second base substrate, forming a photoresist layer on the deposited insulating material, exposing and developing the photoresist layer to form a photoresist pattern, and etching the insulating material layer thereby forming the first insulating material layer 101' and the second insulating material layer 102'. Optionally, the first insulating material layer 101' is formed using silicon oxide ($SiO_y$), and the second insulating material layer 102' is formed using silicon nitride ($SiN_y$, e.g., $Si_3N_4$).

Referring to FIG. 9C, a trench T is formed to extend through the first insulating material layer 101' and the second insulating material layer 102'. The trench T is formed to include a first trench T1 extending through the first insulating material layer 101' and a second trench T2 extending through the second insulating material layer 102'. The trench T may be formed by first etching the second insulating material layer 102' to form the second trench T2 following by over-etching the first insulating material layer 101' to form the first trench T1. Optionally, the second insulating material layer 102' is etched by a dry etchant to form the second trench T2. Optionally, the first insulating material layer 101' is over-etched by a wet etchant to form the first trench T1. Referring to FIG. 9C and FIG. 3A, the second trench T2 has a fourth side S4, a fifth side S5, and a sixth side S6 connecting the fourth side S4 and the fifth side S5. The fourth side S4 on a side of the fifth side S5 distal to the second electrode layer 80 and on a side of the fifth side S5 proximal to the second sub-layer 102. Referring to FIG. 9C and FIG. 3A, the first trench T1 is formed (by over-etching the first insulating material layer 101') to have a first side S1, a second side S2, and a third side S3 connecting the first side S1 and the second side S2. The first side S1 is on a side of the second side S2 distal to the second electrode layer 80 and on a side of the second side S2 proximal to the second sub-layer 102. Optionally, a width of the first side S1 is greater than a width of the fifth side S5.

Referring to FIG. 9D, an organic light emitting layer 110 is formed on a side of the second electrode layer 80 distal to the second base substrate, and a third electrode layer 120 is formed on a side of the organic light emitting layer 110 distal to the second electrode layer 80, thereby forming a counter substrate 2. As discussed above, the first trench T1 and the second trench T2 are formed so that a width of the first side S1 is greater than a width of the fifth side S5. In forming the organic light emitting layer 110, any organic light emitting material deposited in the trench region is deposited inside the first trench T1, the trench T separates the organic light emitting layer 110 in the plurality of subpixels Sp into a plurality of organic light emitting blocks 110b. For example, the organic light emitting layer 110 discontinues at the trench T. In forming the third electrode layer 120, the trench T spaces apart the plurality of third electrode blocks 120b in the plurality of subpixels Sp from each other. For example, the third electrode layer 120 discontinues at the trench T.

Figure 9E:
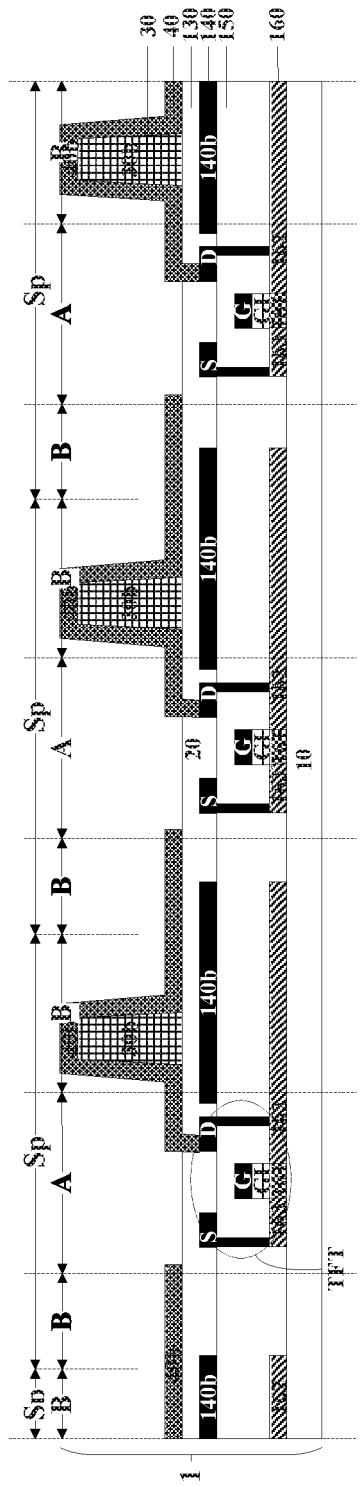

Referring to FIG. 9E, an array substrate 1 is provided. The array substrate 1 is formed to includes a first base substrate 10, a plurality of thin film transistors TFT on the first base substrate 10; a spacer layer 30 configured to maintain a spacing between the array substrate 1 and the counter substrate 2; and a first electrode layer 40 on a side of the spacer layer 30 distal to the first base substrate 10.

Figure 9F:
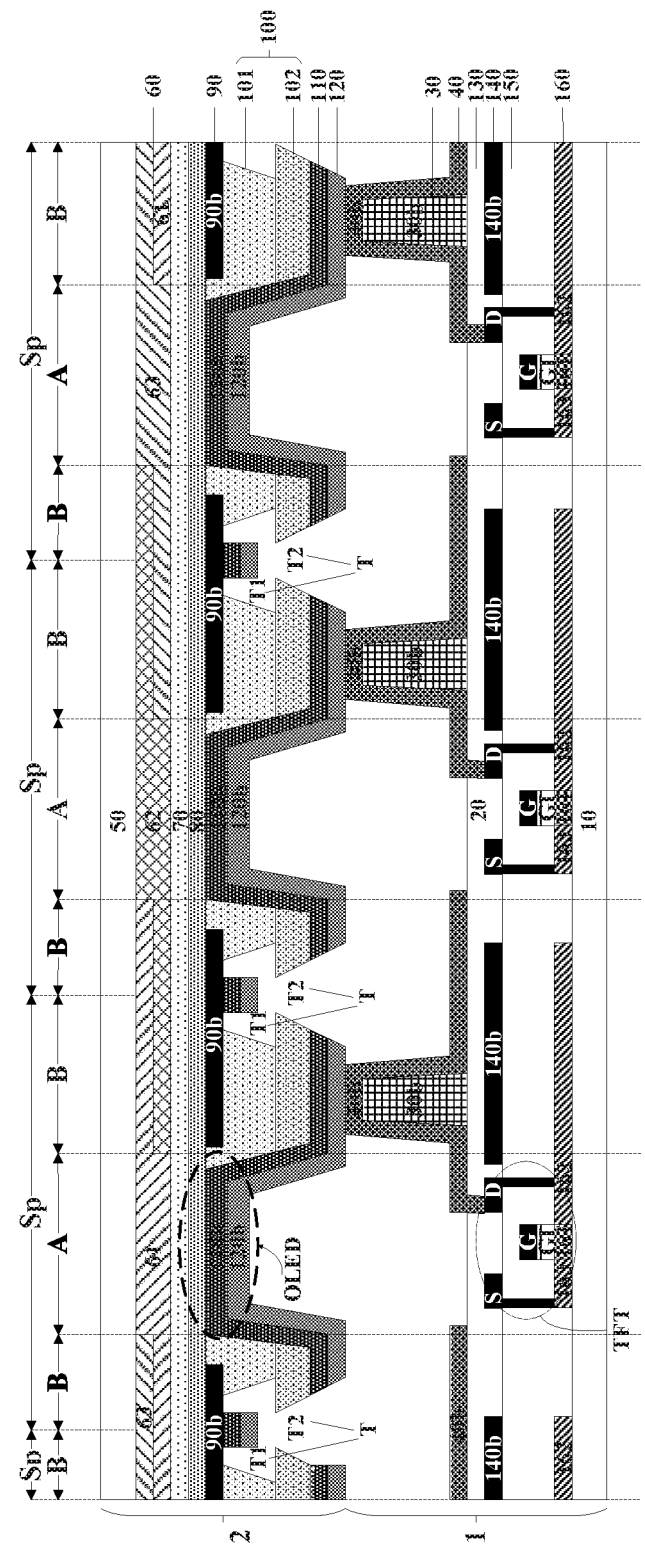

Referring to FIG. 9F, the array substrate 1 and the counter substrate 2 are assembled together to form an organic light emitting diode display panel. The array substrate 1 and the counter substrate 2 are assembled together in a way so that the plurality of first electrode blocks 40b and the plurality of third electrode blocks 120b are substantially aligned. For example, the array substrate 1 and the counter substrate 2 are assembled together so that each of the plurality of first electrode blocks 40b in the array substrate 1 is electrically connected to a respective one of the plurality of third electrode blocks 120b in the counter substrate 2, and in turn electrically connected to the drain electrode D of a respective one of the plurality of thin film transistors TFT. In another example, the array substrate 1 and the counter substrate 2 are assembled together so that each of the plurality of first electrode blocks 40b in the array substrate 1 is in direct contact with (e.g., without any intervening layer or structure) a respective one of the plurality of third electrode blocks 120b in the counter substrate 2.

Figure 10A:
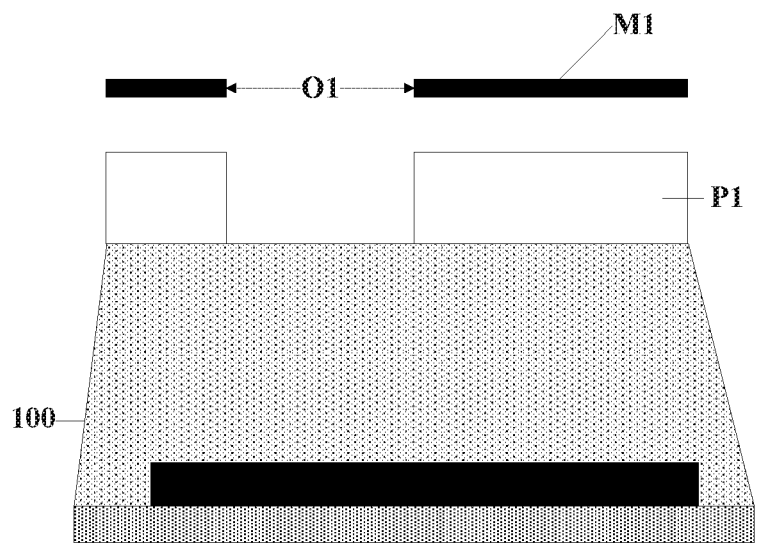
FIGS. 10A to 10F illustrates a process of forming a first trench and a second trench in a pixel definition layer in some embodiments according to the present disclosure.
Figure 10B:
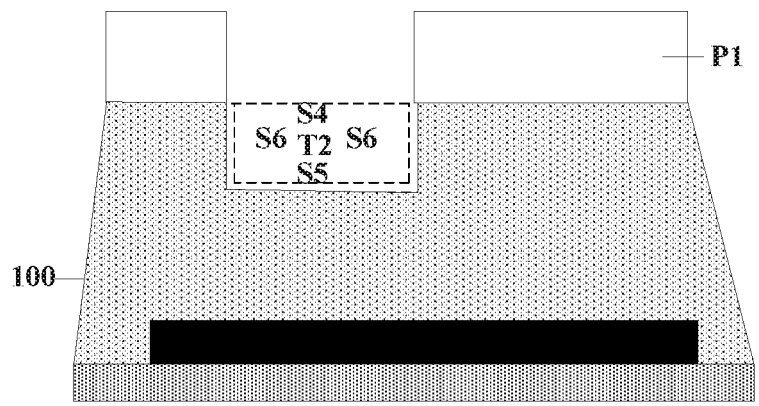
Figure 10C:
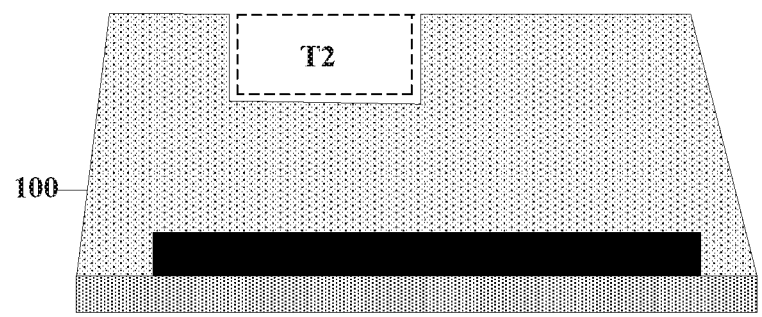
Figure 10D:
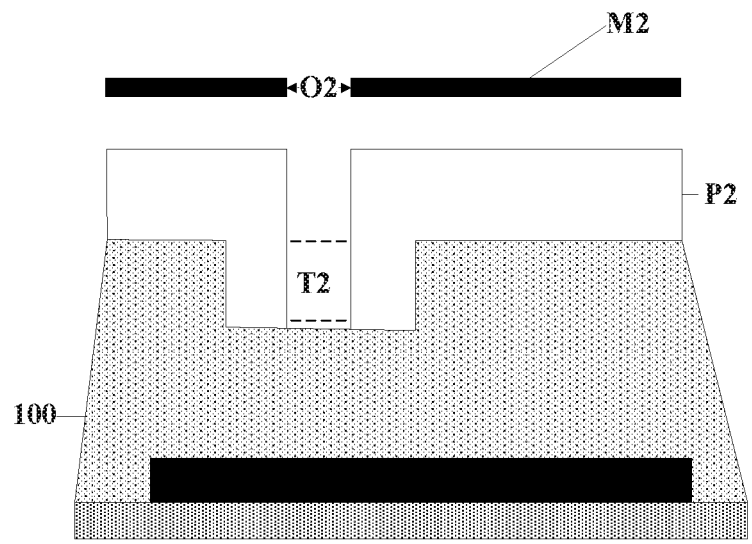
Figure 10E:
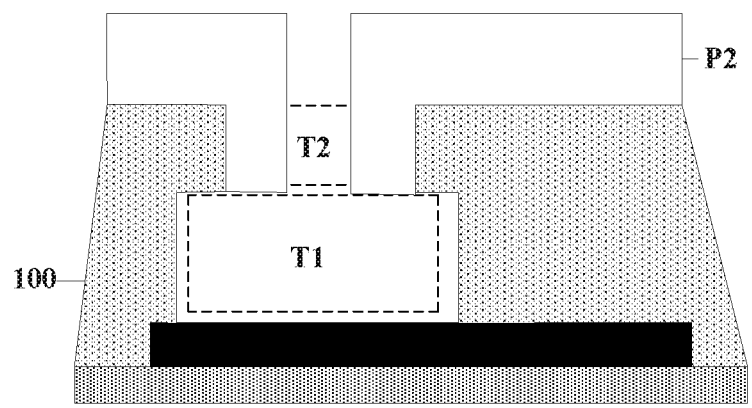
Figure 10F:
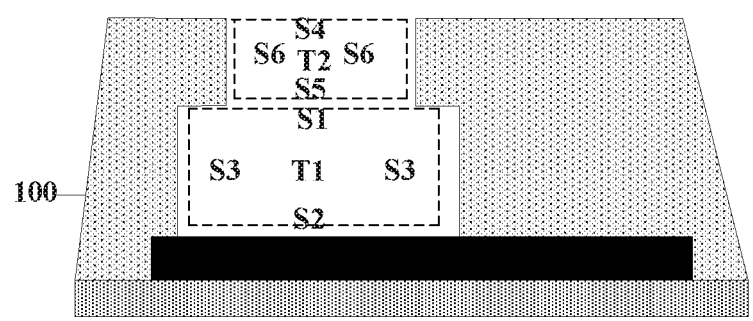

FIGS. 10A to 10F illustrates a process of forming a first trench and a second trench in a pixel definition layer in some embodiments according to the present disclosure. Optionally, the pixel definition layer is a pixel definition layer having a single-layer structure. Referring to FIG. 10A, a first photoresist layer P1 is formed on the pixel definition layer 100 using a first mask plate M1, the first photoresist layer P1 is formed to have a first pattern corresponding to the second trench, exposing a first portion of the pixel definition layer. Referring to FIG. 10B, the first portion of the pixel definition layer 100 exposed by the first pattern of the first photoresist layer P1 is dry-etched to form the second trench T2 partially extending into the pixel definition layer 100. Referring to FIG. 10C, the first photoresist layer P1 is then removed. Referring to FIG. 10D, subsequent to removing the first photoresist layer P1, a second photoresist layer P2 is formed on the pixel definition layer 100 using a second mask plate M2, the second photoresist layer P2 is formed to have a second pattern, exposing a second portion of the pixel definition layer 100. Referring to FIG. 10E, the second portion of the pixel definition layer 100 is wet-etched, thereby forming the first trench T1 connected to the second trench T2. Referring to FIG. 10F, the second photoresist layer P2 is then removed, thereby forming the first trench T1 and the second trench T2 in the pixel definition layer 100 having a single-layer structure. As shown in FIGS. 10A to 10F, the first mask plate M1 has a first opening O1, and the second mask plate M2 has a second opening O2. The second opening O2 has a diameter smaller than a diameter of the first opening O1. Wet-etching the pixel definition layer 100 results in the first trench T1 having an undercut profile such that the width of the first side S1 is greater than the width of the fifth side S5.

In another aspect, the present disclosure provides an organic light emitting diode display apparatus having an organic light emitting diode display panel described herein or fabricated by a method described herein. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode display panel having a plurality of subpixels, comprising:
    an array substrate; and
    a counter substrate facing the array substrate;
    wherein the counter substrate comprises a plurality of organic light emitting diodes;
    wherein the array substrate comprises:
    a first base substrate;
    a plurality of thin film transistors on the first base substrate for driving light emission of the plurality of organic light emitting diodes in the counter substrate; and
    a first electrode layer;
    wherein the first electrode layer electrically connects the plurality of organic light emitting diodes to the plurality of thin film transistors, respectively;
    wherein the counter substrate has a subpixel region and an inter-subpixel region;
    wherein the counter substrate in the inter-subpixel region comprises:
    a second base substrate;
    a second electrode layer on the second base substrate;
    a pixel definition layer defining the plurality of subpixels; and
    a third electrode layer on a side of the pixel definition layer distal to the second electrode layer;
    wherein the first electrode layer in the array substrate comprises a plurality of first electrode blocks respectively electrically connected to drain electrodes of the plurality of thin film transistors; and
    the third electrode layer in the counter substrate comprises a plurality of third electrode blocks respectively electrically connected to the plurality of first electrode blocks in the array substrate;
    wherein the counter substrate in the inter-subpixel region further comprises a fourth electrode layer;
    the fourth electrode layer comprises a plurality of fourth electrode blocks;
    each of the plurality of fourth electrode blocks on a side of the pixel definition layer proximal to the second base substrate; and
    each of the plurality of fourth electrode blocks is electrically connected to the second electrode layer.

2. The organic light emitting diode display panel of claim 1, wherein the array substrate further comprises a spacer layer configured to maintain a spacing between the array substrate and the counter substrate; and
    the first electrode layer is on a side of the spacer layer distal to the first base substrate.

3. The organic light emitting diode display panel of claim 2, wherein the spacer layer comprises a plurality of spacer blocks; each of the plurality of subpixels comprises a subpixel region and the inter-subpixel region; the first electrode layer comprises a plurality of first electrode blocks, and
    the plurality of first electrode blocks are respectively on a side of the plurality of spacer blocks distal to the first base substrate in the inter-subpixel region.

4. The organic light emitting diode display panel of claim 3, wherein each of the plurality of subpixels comprises at least one of the plurality of the spacer blocks.

5. The organic light emitting diode display panel of claim 1, wherein the counter substrate in the subpixel region comprises:
    the second electrode layer on the second base substrate;
    an organic light emitting layer on a side of the second electrode layer distal to the second base substrate; and
    the third electrode layer on a side of the organic light emitting layer distal to the second electrode layer;
    wherein each of the plurality of third electrode blocks in each of the plurality of subpixels extends from the subpixel region into the inter-subpixel region.

6. The organic light emitting diode display panel of claim 5, further comprising a trench extending through the pixel definition layer;
    wherein the trench spaces apart the plurality of third electrode blocks in the plurality of subpixels from each other, and separates the organic light emitting layer in the plurality of subpixels into a plurality of organic light emitting blocks.

7. The organic light emitting diode display panel of claim 6, wherein the trench has an opening side and a closed side opposite to the opening side;
the opening side is on a side of the closed side distal to the second electrode layer; and
a width of the closed side is greater than a width of the opening side.

8. The organic light emitting diode display panel of claim 7, wherein the trench comprises a first trench and a second trench connected to the first trench;
the first trench has a first side, a second side, and a third side connecting the first side and the second side, the first side being on a side of the second side distal to the second electrode layer;
the second trench has a fourth side, a fifth side, and a sixth side connecting the fourth side and the fifth side, the fourth side on a side of the fifth side distal to the second electrode layer; and
a width of the first side is greater than a width of the fifth side.

9. The organic light emitting diode display panel of claim 8, wherein the pixel definition layer comprises:
a first sub-layer on a side of the second electrode layer distal to the second base substrate; and
a second sub-layer on a side of the first sub-layer distal to the second electrode layer;
wherein the first trench extends through the first sub-layer and the second trench extends through the second sub-layer.

10. The organic light emitting diode display panel of claim 7, wherein the trench is a single trench extending through the pixel definition layer;
the trench has a seventh side, an eighth side, and a ninth side connecting the seventh side and the eighth side;
the seventh side is on a side of the eighth side distal to the second electrode layer; and
a width of the eighth side is greater than a width of the seventh side.

11. The organic light emitting diode display panel of claim 1, wherein the counter substrate further comprises a color filter on the second base substrate and comprising a plurality of color filter blocks;
wherein edges of adjacent color filter blocks of the plurality of color filter blocks are in the inter-subpixel region.

12. The organic light emitting diode display panel of claim 11, wherein the counter substrate further comprises an overcoat layer on a side of the color filter distal to the second base substrate;
wherein the second electrode layer is on a side of the overcoat layer distal to the second base substrate.

13. The organic light emitting diode display panel of claim 1, wherein the fourth electrode layer is on a side of the second electrode layer distal to the second base substrate.

14. The organic light emitting diode display panel of claim 1, wherein the counter substrate in the inter-subpixel region further comprises an organic light emitting layer between the pixel definition layer and the third electrode layer; and
the organic light emitting layer in each of the plurality of subpixels extends from the subpixel region into the inter-subpixel region.

15. The organic light emitting diode display panel of claim 1, wherein the array substrate further comprises a capacitor electrode layer between the first electrode layer and the first base substrate; and
the capacitor electrode layer comprises a plurality of capacitor electrode blocks, each of which is in a respective one of the plurality of subpixels.

16. A method of fabricating an organic light emitting diode display panel, comprising:
forming a counter substrate;
forming an array substrate; and
assembling the counter substrate and the array substrate together;
wherein forming the counter substrate comprises forming a plurality of organic light emitting diodes; and
forming the array substrate comprises forming a plurality of thin film transistors on a first base substrate for driving light emission of the plurality of organic light emitting diodes in the counter substrate;
forming a spacer layer configured to maintain a spacing between the array substrate and the counter substrate; and
forming a first electrode layer on a side of the spacer layer distal to the first base substrate and electrically connected to the plurality of thin film transistors;
wherein the counter substrate has a subpixel region and an inter-subpixel region;
wherein the counter substrate in the inter-subpixel region comprises:
a second base substrate;
a second electrode layer on the second base substrate;
a pixel definition layer defining the plurality of subpixels; and
a third electrode layer on a side of the pixel definition layer distal to the second electrode layer;
wherein the first electrode layer in the array substrate comprises a plurality of first electrode blocks respectively electrically connected to drain electrodes of the plurality of thin film transistors; and
the third electrode layer in the counter substrate comprises a plurality of third electrode blocks respectively electrically connected to the plurality of first electrode blocks in the array substrate;
wherein the counter substrate in the inter-subpixel region further comprises a fourth electrode layer;
the fourth electrode layer comprises a plurality of fourth electrode blocks;
each of the plurality of fourth electrode blocks on a side of the pixel definition layer proximal to the second base substrate; and
each of the plurality of fourth electrode blocks is electrically connected to the second electrode layer.

* * * * *